United States Patent [19]

Wada et al.

[11] Patent Number: 5,396,082
[45] Date of Patent: Mar. 7, 1995

[54] SEMICONDUCTOR SUBSTRATE AND DEVICE WITH A SURFACE LAYER STRUCTURE

[75] Inventors: Yoshinori Wada, Machida; Kazumi Wada, Atsugi; Takahisa Ohno, Tokyo, all of Japan

[73] Assignee: Nippon Telegraph & Telephone Corporation, Tokyo, Japan

[21] Appl. No.: 205,771

[22] Filed: Mar. 4, 1994

Related U.S. Application Data

[63] Continuation of Ser. No. 868,304, Apr. 14, 1992.

[30] Foreign Application Priority Data

Apr. 15, 1991 [JP] Japan ............................. 3-109713
Nov. 20, 1991 [JP] Japan ............................. 3-331447

[51] Int. Cl.$^6$ ............................................. H01L 29/161
[52] U.S. Cl. .................................... 257/13; 257/16; 257/17; 257/18; 257/20; 372/45
[58] Field of Search ................ 257/18, 17, 20, 22, 257/21, 24, 27, 13, 19, 16, 197, 194; 372/45, 46

[56] References Cited

U.S. PATENT DOCUMENTS

5,001,521  3/1991  Okuda et al. ....................... 257/13 X

OTHER PUBLICATIONS

Gendry et al., "Improved Electronic Properties of As-Based III-V Compound Semiconductor Surface Stabilized with Phosphorus," Third Int'l Conf. on Indium Phosphide and Related Materials, Apr. 8-11, 1991, IEEE.
Viktorovich et al, "Improved Electronic Properties of GaAs Surfaces Stabilized with Phosphorous," *Appl. Phys. Lett.* 58 (21), 27 May 1991, pp. 2387-2389.
Asai et al., "Energy Band-Gap Shift with Elastic Strain in $GA_x In_{1-x} P$ Epitaxial Layers on (001) GaAs Substrates," *J. Appl. Phys.*, 54(4), Apr. 1983, pp. 2052-2056.
Pankove et al., "Passivation of GaAs Surfaces," Journal of GaAs Surfaces, *Journal of Electronic Materials*, vol. 12, No. 2, 1983, pp. 359-369.

Fan et al, "Marked Reduction of the Surface/Interface States of GaAs by $(NH_4)_2 S_x$ Treatment," *Japanese Journal of Applied Physics*, vol. 28, No. 12, Dec. 1989, pp. L2255-L2257.
Extended Abstracts, The Autumn Meeting, 1990, of the Japan Society of Applied Physics, Report No. 26a-S-Q-20, 1990, pp. 911 & 1067.
Hasebawa et al, "Unified Disorder Induced Gap State Model for Insulator–Semiconductor and Metal–Semiconductor Interfaces," *J. Vac. Sci. Technol.*, B4(4), Jul.-/Aug. 1986, pp. 1130-1135.
Japanese Journal of Applied Physics, vol. 27, No. 12, Dec. 1988, pp. L2367-2369. "A Model to Explain the Effective Passivation of the GaAs Surface by $(NH_4)_2S_x$ Treatment", Yasuo Nannichi et al.
Defect Control in Semiconductors, 1990, pp. 849–853, "Defect Passivation of GaAs Surface By Phosphidization", Takashi Sugino et al., Elsevier Science Publishers B. V., North-Holland.

(List continued on next page.)

Primary Examiner—William Mintel
Attorney, Agent, or Firm—Spencer, Frank & Schneider

[57] ABSTRACT

The semiconductor device has a semiconductor substrate composed essentially of a III-V compound semiconductor containing Ga and As, and a surface layer structure provided on the semiconductor substrate and this layer has a composition different from that of the semiconductor substrate. The surface layer structure includes a strained layer epitaxially grown on the surface of the semiconductor substrate and composed essentially of at least one-element selected from the group consisting of indium, gallium, aluminum and boron, and at least one element selected from the group consisting of arsenic and phosphorus. The strained layer has a composition different from that of the semiconductor substrate The strained layer has a valence band maximum lower in energy than that of the valence band maximum of the semiconductor substrate.

27 Claims, 16 Drawing Sheets

Extended Abstract and translation of the Autumn Meeting, 1990 of The Japan Society of Applied Physics; Report No. 26a-SQ-20, "Suppression of Emitter Size Effect of HBT by Utilizing $(NH_4)_2S_x$ Treatment", S. Shikata et al.

Extended Abstract and translation of the Autumn Meeting, 1990, of the Japan Society of Applied Physics; Report No. 28a-SA-20, "Improvement of High Power Characteristics of AlGaAs Laser Diodes by $(HN_4)_2S_x$ Facet Treatment-The Effect of $Al_2O_3$ Deposition", K. Sasaki et al.

Appl. Phys. Lett. vol. 55, No. 16, Oct. 16, 1989; "Sulfur Passivation of GaAs Surfaces: A Model For Reduced Surface Recombination Without Band Flattening", pp. 1653–1655, C. J. Spindt et al.

Journal of Electronic Materials, vol. 12, No. 2, 1983; pp. 359–370, "Passivation of GaAs Surfaces", J. I. Pankove et al.

J. Vac Sci. Technol B, vol. 4, No. 4, Jul./Aug. 1986; pp. 1130–1138, "Unified Disorder Induced Gap State Model For Insulator–Semiconductor and Metal–Semiconductor Interfaces", Hideki Hasegawa et al.

J. Appl. Phys., vol. 54, No. 4, Apr. 1983; pp. 2052–2056, "Energy Band–Gap Shift With Elastic Strain In $Ga_x In_{1-x}P$ Epitaxial Layers on (001) GaAs Substrates", Hiromitsu Asai et al.

Appl. Phys. Lett., vol. 45, No. 10, Nov. 15, 1984; pp. 1127–1129, "Passivation of The GaAs Surface By An Amorphous Phosphorus Overlayer", D. J. Olego et al.

Physical Review B, vol. 42, No. 17, Dec. 15, 1990, "First–Principles Study of Sulfur Passivation of GaAs (001) Surfaces", Ohno et al., pp. 11–194–11–196.

Physical Review B, vol. 44, No. 12, Sep. 15, 1991, "Sulfur Passivation of GaAs Surfaces", Ohno et al., pp. 6306–6311.

Extended Abstract of the 1991 International Conference on Solid State Devices and Materials; Yokohama, Japan; "A New Surface Passivation of GaAs Using CVD-Atomic Layer Passivation", Wada et al., pp. 683–685.

Surface Science, vol. 255, 1991, "Passivation of GaAs (001) Surfaces By Chalcogen Atoms (S, Se and Te)", Ohno et al., pp. 229–236.

Materials Science Forum, vol. 83–87, 1992, "AB Initio Calculations on Effect of Ga-S Bonds on Passivation Of GaAs Surface-A Proposal For New Surface Treatment", Ohno et al., pp. 1403–1408.

PF Activity Report 1991, "Photoemission Analysis Of $H_2S$-Treated GaAs Surfaces", Sugahara et al.; Proposal No. 90-C008.

Translation of Excerpt from Extended Abstracts, The Autumn Meeting, 1990, Applied Physics, Report No. 26a-Sq-14.

Translation of Excerpt From Extended Abstracts, The 38th Spring Meeting, 1991, The Japan Society of Applied Physics and Related Societies, Report No. 30p--N-14.

Translation of Excerpt from Extended Abstracts, The 38th Spring Meeting, 1991; The Japan Society of Applied Physics and Related Societies, Report No. 30p--N-17.

Translation of Excerpt from Extended Abstracts, The 52nd Autumn Meeting, 1991, The Japan Society of Applied Physics, Report No. 10p-F-5.

Translation of Excerpt from Text of Training Course On "New Surface Material and Expitaxy", Jul. 26, 1991, by The Japan Society of Physics, No. 14, GaAs Surface and Adsorption Layer.

Translation of Excerpt from Extended Abstracts, The Spring Meeting, 1992, The Japan Society of Applied Physics, Report No. 30a-Q-2.

Kazumi Wada, Denki Kagaku, 60, No. 3, pp. 169–174 (1992), The Japan Society of Electrochemistry.

H. Nagai et al., "III–V Mixed Crystals," pp. 188–222 (1988), Corona Publishing Co., Ltd., Tokyo.

SEMICONDUCTOR SUBSTRATE AND DEVICE WITH A SURFACE LAYER STRUCTURE

This application is a continuation of application Ser. No. 07/868,304, filed Apr. 14, 1992.

BACKGROUND OF THE INVENTION

1. Field of the Invention

The present invention relates to a semiconductor substrate having a surface layer structure and more particularly to a semiconductor substrate made of a GaAS or Ga, As-containing ternary or more alloy or mixed crystal having a surface layer structure on which a metal or insulator can be provided. Further, the present invention relates to a semiconductor device having a semiconductor substrate having such a surface layer structure. The present invention also relates to a method of fabricating a semiconductor substrate and a method of fabricating a semiconductor device having a semiconductor substrate with such a surface layer structure.

2. Description of the Prior Art

Periodicity of a crystal is lost on the surface of a semiconductor and one or more states for carriers (electrons and holes) tend to appear in the vicinity of the surface of the semiconductor. These states are called surface (or interface) states. Since surface states have a great influence on the performance and reliability of the semiconductor devices, so-called passivation or inactivation of the surface is usually carried out, whereby the surface of the semiconductor is covered with an insulator layer to appropriately terminate unbonded dangling bonds to prevent the occurrence of surface states in, for example, the forbidden band, thereby rendering the surface inactive visa vis the external atmosphere surrounding the semiconductor. In the case where a surface (interface) state with an energy level in the forbidden band does exist in the vicinity of an area a semiconductor covered with a native oxide or passivated layer, that surface (interface) state catches or releases carriers (electrons or holes) in the band, with the result that excessive carriers, if any, in the vicinity of the surface, cause recombination of electrons with holes, thus having a great influence on the behavior or performance of the semiconductor device.

On the surface of a III-V compound semiconductor such as GaAs, a large surface recombination velocity is quite often observed. This presents an obstacle to fabricating actual semiconductor devices having characteristics as close as possible to ideal ones. This is considered to be attributable to the existence of surface states in high densities on the surfaces of the semiconductor. Accordingly, various surface passivation techniques have been proposed in order to suppress the occurrence of high density surface states.

For example, a surface structure has been known in which the surface of a GaAs semiconductor is covered with a surface passivation atom such as sulfur (S) or phosphorus (P) to form a monoatomic layer or thicker overcoat. The term "surface passivation" as used herein refers to improvements in electrical characteristics such as the reduction in the rate of recombination of carriers on the surface of a semiconductor, i.e., the reduction in leakage current in pn junctions, or the reduction in the surface (or interface) state density to relax the pinning of the Fermi level on the surface.

FIG. 1 is a cross sectional view showing a GaAs semiconductor substrate having a conventional surface layer structure. FIG. 2 is an energy band diagram for the cross section of the semiconductor device having the surface layer structure as shown in FIG. 1. In FIG. 1, reference numeral 10 denotes a semiconductor substrate having a surface layer structure, 12 denotes a GaAs semiconductor substrate, 12A and 12B denote front and back facets or surfaces of the semiconductor substrate, respectively, and 15 denotes a surface passivation monolayer. The GaAs semiconductor substrate 12 has a layer or overcoat of S or P of a thickness of about one atom or more on the facet 12A on the front side of the semiconductor. FIG. 2 shows an energy distribution in the direction from the front facet 12A toward the back facet 12B where C, V and IS stand for a conduction band, a valence band and surface (or interface) states, respectively, CBM and VBM stand for a conduction band minimum and a valence band maximum, respectively, Ev is a maximum of the valence band of the substrate, and FB stands for a forbidden band of the substrate 12. In the surface layer structure as shown in FIG. 1, the surface states, IS exist exposedly or unresonantly in the forbidden band which is between the conduction band minimum, CBM and the valence band maximum, VBM as shown in FIG. 2. Note that on actual surfaces, the Fermi level is fixed to surface states. This phenomenon is called pinning by surface states. Due to pinning, CBM and VBM increase toward the left hand side in FIG. 2 under no external voltage. That is, on the actual surfaces, CBM and VBM are not linear nor horizontal (like those shown in FIG. 2), but, for example, go up or ascend toward the left hand side in n-type semiconductors. However, for the sake of simplicity of explanation and in order to clearly illustrate that surface states are in the forbidden band or band gap, CBM and VBM potentials are each illustrated as horizontal, and relations of CBM and VBM with the Fermi level are omitted from the following explanation.

To realize the aforementioned surface layer structure, various methods have been proposed. For example, a wet treatment is known in which a GaAs wafer is immersed in an ammonium polysulfide solution as described in, for example, Nannichi et al., JJAP, vol. 27, p. L2367 (1988). Also, a dry treatment using $H_2S$ gas is known. For the P overcoat, a method has been known in which GaAs is exposed in a plasma of phosphine ($PH_3$) gas as described in Sugino, et al., Defect Control in Semiconductor, p. 849, Elsevier Science Publishers B.V., North-Holland (1990).

Among the aforementioned methods, the S overcoats have been experimentally demonstrated to be generally effective for surface passivation of GaAs. For example, the provision of an S overcoat is known to increase the intensity of photoluminescence (hereafter, sometimes referred to simply as "PL intensity") by 5 to 8 times and decreased interface state density to $1.2 \times 10^{11}$ $cm^{-2}eV^{-1}$ (cf. Fan et al., JJAP, vol. 28, p. L2255 (1989)).

Provision of a P overcoat on the surface of GaAs was shown to strengthen dependence of the height of barrier of a Schottky contact on the work function as compared with non-passivated surface (cf. Sugino, et al., Defect Control in Semiconductor, p. 849, Elsevier Science Publishers B.V., North-Holland (1990)), confirming relaxation of the pinning of Fermi level at the surface state. However, the P overcoat remained less effective than the S overcoat.

On the other hand, in the application to devices, semiconductor chips such as P-coated GaAs or S-coated compound semiconductor chips have been protected by depositing an insulator layer such as a layer of silicon oxide on the surface thereof. More specifically, in hereto bipolar transistors (HBT's), the provision of an S layer on pn junctions resulted in an increase in the current gain (cf, for example, Shikada, et al., 1990 Autumn Meeting of Japan Society of Applied Physics, Report No. 26a-SQ-20), or its provision on a reflecting facet of a laser resulted in improvement in the high output properties of the laser (cf., Sasaki, et al., 1990 Spring Meeting of Japan Society of Applied Physics, Report No. 28a-SA-20).

On the other hand, it has also been reported that the provision of an S overcoat caused the pinning of the Fermi level by the surface state (cf. Spindt, et al., APL, vol. 55 (16), p. 1653 (1989)).

Further, a method has been proposed in which a material having a band gap wider than GaAs, such as AlGaAs, is epitaxially grown thick (about 200 Angstroms or more) on the surface of a GaAs semiconductor to suppress high density surface states present at the surface of the semiconductor (cf., J. I. Pankove, et al., J. of Electronic Materials, 12, p. 359 (1983)).

FIG. 3 is a schematic cross sectional view showing a semiconductor substrate with the aforementioned thick conventional surface layer structure. In FIG. 3, reference numerals 10, 12, and 12A are the same as in FIG. 1, and 13 is a wide band gap material layer, and 13A is a surface of the wide band gap material layer 13. Symbol D indicates distance from the surface 13A of the wide band gap material layer, and symbol $D_1$ indicates the distance of the surface (interface) 12A from the surface 13A. In the arrangement shown in FIG. 3, the wide band gap material layer 13 in place of the covering layer 16 in FIG. 1 is provided on the substrate 12.

FIG. 4 is a schematic energy band diagram of the cross section of the conventional GaAs semiconductor substrate shown in FIG. 3, with plotting energy versus distance from the surface 13A of the wide band gap material layer 13 opposing the front facet 12A of the GaAs semiconductor 12 toward the back facet 12B (not shown) of the semiconductor 12. In FIG. 4, $CBM_1$ indicates the conduction band minimum of the semiconductor substrate 12, $CBM_{02}$ indicates the conduction band minimum of the wide band gap material layer 13, $VBM_1$ indicates the valence band maximum of the substrate 12, and $VBM_{02}$ indicates the valence band maximum of the wide band gap material layer 13, $Ec_1$ indicates the energy of conduction band minimum of the substrate 12, $Ec_2$ indicates the energy of the conduction band minimum of the wide band gap material layer 13, $Ev_1$ indicates the energy of the valence band maximum of the substrate 12, $Ev_2$ indicates the energy of the valence band maximum of the wide band gap material layer 13, and $D_1$ indicates the distance of the interface 12A from the surface 13A of the wide band gap material layer 13. With respect to the valence band maximum $VBM_1$ and conduction band minimum $CBM_1$ of the GaAs semiconductor, the valence band maximum $VBM_2$ and conduction band minimum $CBM_2$ of the wide band gap material have energy level gaps, $\Delta Ev$ ($=E_{v1}-E_{v2}$), and $\Delta Ec$ ($=E_{c2}-E_{c1}$), respectively, thus forming a thick potential barrier. The thick potential barrier prevents carriers (electrons and holes) from approaching the surface of the semiconductor. Therefore, no surface recombination occurs wherever surface states exist in the surface layer 13A of the wide band gap material 13.

However, the conventional method of providing a thick layer of a wide band gap material such as S or P on the surface of a semiconductor, is not applicable so far as currently adopted structural design fabrication techniques are concerned. If one were to forcibly use such a conventional method, a supply of electrons would be produced from the thick wide gap material layer, and the resulting semiconductor device would have to be classified (from the viewpoint of the principle of operation) as a high electron mobility transistor (HEMT), and HEMTs require high technology techniques for fabricating integrated circuits.

In order to obtain actual devices having characteristics as close as possible to ideal ones, there has been a keen desire for further improvement in the suppression of high density surface states existing in the vicinity of the surface of the semiconductor.

SUMMARY OF THE INVENTION

It is an object of the present invention to provide a semiconductor device having a surface layer structure which suppresses the occurrence of the pinning of Fermi level on the surface of the semiconductor and increases absolute amount of effect of surface passivation.

It is another object of the present invention to provide a compound semiconductor device having a surface layer structure which is of a surface band structure being arranged at will and which is easy to control.

It is still another object of the present invention to provide a method of fabricating a semiconductor device having such a surface layer structure.

As a result or extensive research, the present inventors have now found that the aforementioned objects of the present invention can be achieved by the provision of a strained layer having lattice constants different from those of a semiconductor substrate on the surface of the substrate by epitaxial growth.

(1) Therefore, according to one aspect of the present invention, there is provided a semiconductor substrate consisting essentially of a III-V compound semiconductor containing Ga and As, and a surface layer structure provided on the semiconductor substrate, the semiconductor substrate having a first valence band maximum, and a first conduction band minimum, wherein the surface layer structure comprises a strained layer epitaxially grown on the surface of the semiconductor substrate and consists essentially of at least one first element selected from the group consisting of indium, gallium, aluminum and boron, and at least one second element selected from the group consisting of arsenic and phosphorus, the strained layer having a composition different from that of the semiconductor substrate, and wherein the strained layer has a second valence band maximum and a second conduction band minimum, the second valence band maximum being at an energy position lower in energy than that of the first valence band maximum of the semiconductor substrate.

(2) According to another aspect of the present invention, there is provided a semiconductor device having a semiconductor substrate composed essentially of a III-V compound semiconductor containing Ga and As, and a surface layer structure provided on the semiconductor substrate and having a composition different from that of the semiconductor substrate, the semiconductor substrate having a first valence band maximum, and a first conduction band minimum, wherein the surface layer structure comprises a strained layer epitaxially grown on the surface of the semiconductor substrate and consisting essentially of at least one first element selected from the group consisting of indium, gallium, aluminum and boron, and at least one second element selected from the group consisting of arsenic and phosphorus, the strained layer having a composition different from that of the semiconductor substrate, and wherein the strained layer has a second valence band maximum and a second conduction band minimum, the second valence band maximum of the strained layer being at an energy position lower in energy than that of the first valence band maximum of the semiconductor substrate.

(3) Here, in the aforementioned semiconductor substrate (1) and device (2), the strained layer may be an ultrathin layer.

(4) In the aforementioned semiconductor substrate and device of (3), the ultrathin layer may have a first portion positioned on a side of the semiconductor substrate, the first portion of the strained layer having lattice constants same as or smaller than those of the semiconductor substrate.

(5) In the aforementioned semiconductor substrate and device of (4), the ultrathin layer may have a second portion positioned on the uppermost side thereof, the second portion having lattice constants greater than those of the first portion.

(6) In the aforementioned semiconductor substrate and device of (5), The second valence band maximum of the strained layer may preferably be lower in energy than the first valence band maximum of the semiconductor substrate.

(7) In the aforementioned semiconductor substrate and device of (4), the ultrathin layer may have a thickness of 30 Angstroms or less.

(8) In the aforementioned semiconductor substrate and device of (7), the strained layer may have on its outermost surface a layer of phosphorus.

(9) In the aforementioned semiconductor substrate and device of (7), the strained layer has on its outermost surface a layer of sulfur.

(10) In the aforementioned semiconductor substrate and device of (7), the strained layer may have on its outermost surface a layer of phosphorus in a state where it is bonded with oxygen.

(11) In the aforementioned semiconductor substrate and device of (7), the strained layer may contain indium.

(12) In the aforementioned semiconductor substrate and device of (11), the strained layer may contain indium phosphide.

(13) In the aforementioned semiconductor substrate and device of (11), the strained layer may contain indium gallium arsenide phosphide.

(14) In the aforementioned semiconductor substrate and device of (12), the strained layer may have on its outermost surface a layer of phosphorus in a state where it is bonded with oxygen.

(15) In the aforementioned semiconductor substrate and device of (13), the strained layer may have on its outermost surface a layer of phosphorus in a state where it is bonded with oxygen.

(16) In the aforementioned semiconductor substrate and device of (7), the strained layer may have a thickness of 15 Angstroms or less.

(17) In the aforementioned semiconductor substrate and device of (8), the strained layer may have a thickness of 15 Angstroms or less.

(18) In the aforementioned semiconductor substrate and device of (9), the strained layer may have a thickness of 15 Angstroms or less.

(19) In the aforementioned semiconductor substrate and device of (10), the strained layer may have a thickness of 15 Angstroms or less.

(20) In the aforementioned semiconductor substrate and device of (14), the strained layer may have a thickness of 15 Angstroms or less.

(21) In the aforementioned semiconductor substrate and device of (15), the strained layer may have a thickness of 15 Angstroms or less.

(22) In the aforementioned semiconductor substrate and device of (6), the ultrathin layer may have thereon an amorphous insulator layer.

(23) In the aforementioned semiconductor substrate and device of (22), the amorphous insulator layer may be composed of silicon oxide.

Application of the present invention to field effect transistors made of a compound semiconductor having the surface layer structure characterized by the present invention in the form of a protective layer for the surface of the device, can realize reduction of noises due to surface conditions, decrease in series resistance which occurs due to the surface depletion layer. Further, application of the present invention to HBT or the like semiconductor devices having a surface layer structure characterized by the present invention as a surface protective layer for pn junctions, can realize a reduction in leak current occurring due to surface conditions and a concomitant increase in current gain. Also, the present invention enables improved controlling of surface conditions to prevent undesirable contamination of impurities into the interface between the insulator layer, and can realize metal/insulator/semiconductor (MIS) devices which can accumulate and control minority carriers of GaAs.

Provision of a portion of the heteroepitaxial layer on the side of the semiconductor substrate which consists of a semiconductor material having lattice constants equal to or smaller than those of the substrate and provision of another portion of the strained layer on the substrate-side portion which consists of a semiconductor material having lattice constants greater than those of the substrate-side portion can further improve controllability of the composition or surface conditions of the semiconductor device.

The above and other objects, effects, features and advantages of the present invention will become more apparent from the following description of embodiments thereof taken in conjunction with the accompanying drawings.

DESCRIPTION OF PREFERRED EMBODIMENTS

Referring to FIGS. 5 to 20, the present invention will be described in detail hereinbelow.

Figure 5:
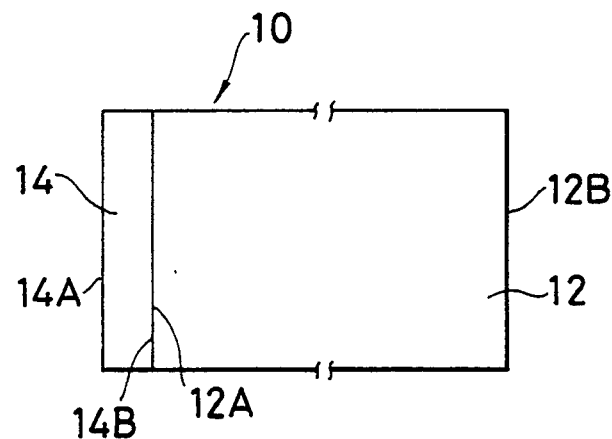
FIG. 5 is a schematic cross sectional view showing a semiconductor substrate with a surface layer structure in accordance with one embodiment of the present invention.

FIG. 5 is a schematic cross sectional view showing a semiconductor substrate with a surface layer structure in accordance with one embodiment of the present invention. In FIG. 5, reference numeral 10 denotes a semiconductor substrate with a surface layer structure, 12 a semiconductor substrate, 12A a front surface of the semiconductor substrate, 12B a back surface of the semiconductor substrate, 14 a strained layer, 14A a surface of the strained layer opposite to the front surface 12A of the semiconductor, and 14B a surface of the strained layer contacting the front surface 12A of the semiconductor substrate.

In the arrangement shown in FIG. 5, the semiconductor substrate 12 has the strained layer 14 on the front surface 12A. The strained layer 14 is intended to give a compression stress to the substrate. As is known in the art, generally, application of a compression stress to a substrate results in widening of its band gap while application of a tensile strength causes narrowing of the energy band of the substrate.

As the semiconductor substrate 12, various III-V compound semiconductors containing gallium (Ga) and arsenic (As) can be used, for example, GaAs or GaAs type mixed crystal semiconductors. The mixed crystal semiconductors can be represented by formula (I) below:

$$Al_zGa_xIn_yAs_rP_s \qquad (I)$$

wherein $$y+z<1,$$

and $$x+y+z=1;$$

and $$s<1,$$

and $$r+s=1.$$

Specific examples of the composition of the substrate which can be used in the present invention includes GaAs, AlGaAs, InGaAs, InGaAsP, and InGaAlAs as well as wafers having these compositions as epitaxially grown layers, respectively.

The strained layer 14 is an ultrathin layer of a III-V compound semiconductor mixed crystal having a composition different from that of the III-V compound semiconductor containing Ga and As constituting the semiconductor substrate 12. The strained layer 14 has a composition composed essentially of at least one first element selected from the group consisting of indium (In), gallium (Ga), aluminum (Al) and boron (B), and at least one second element selected from the group consisting of arsenic (As) and phosphorus (P). Specific examples of the composition of the strained layer include InGaP, InGaAs, InGasAsP, InGaAlAs, InAlAs, AlGaAs, GaAs, BP and the like.

The thickness of the strained layer 14 is two atomic layers (one molecular layer: about 0.5 nm) or more but does not exceed 3 nm.

If that thickness is less than two atomic layers or about 0.5 nm, it is difficult to give a sufficient compression stress to the substrate while the thickness of the strained layer 14 exceeding 3 nm could cause pinning of surface states in the band gap of the substrate under high electric field.

Figure 6:
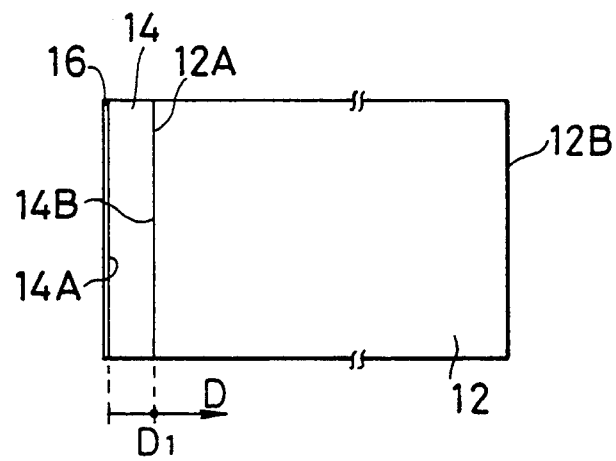
FIG. 6 is a schematic cross sectional view showing a semiconductor substrate with a surface layer structure in accordance with another embodiment of the present invention.

FIG. 6 is a schematic cross sectional view showing a semiconductor substrate with a surface layer structure in accordance with another embodiment of the present invention. In FIG. 6, reference numerals 12, 12A, 12B, 14, 14A and 14B, and symbols D and $D_1$ are the same as in FIGS. 3 and 5, and 16 denotes a covering layer. In the arrangement shown in FIG. 6, the covering layer 16 is provided on the surface 14A of the strained layer 14. The covering layer 16 is a layer of phosphorus (P), sulfur (S), or phosphorus in a state where it is combined with oxygen. It is sufficient that the covering layer may be one atomic layer thick.

Figure 7:
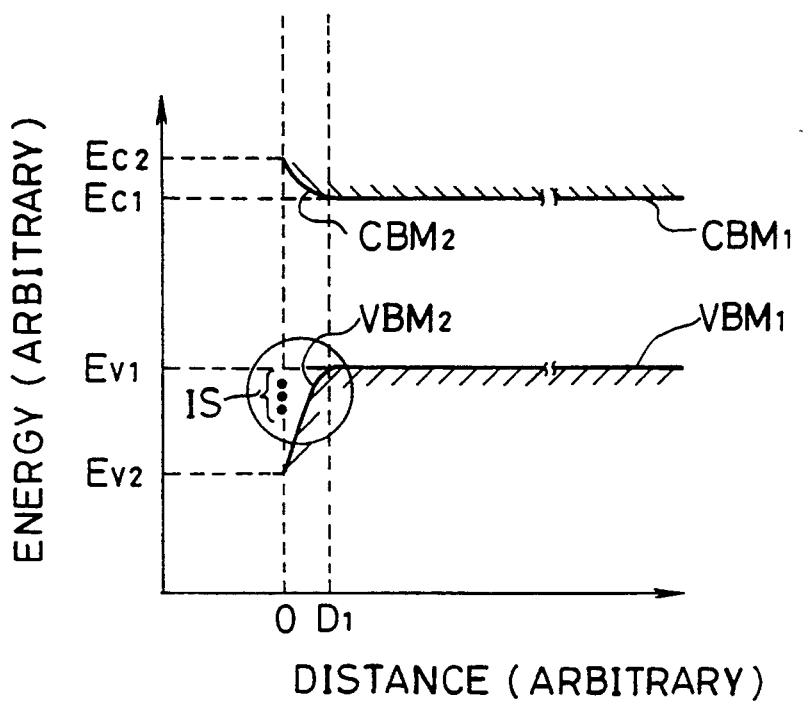
FIG. 7 is a schematic energy band diagram illustrating the energy band of the cross section of the semiconductor substrate of the present invention shown in FIG. 6.

FIG. 7 is a schematic energy band diagram illustrating the energy band of the cross section of the semiconductor substrate of the present invention shown in FIG. 6, with plotting energy level against distance from the surface 14A of the strained layer 14 opposite to the front surface 12A of the substrate 12 toward the back surface 12B of the substrate 12. In FIG. 7, symbols $D_1$, $CBM_1$, $VBM_1$, $EV_1$, and $EV_2$ are the same as in FIG. 4, and $CBM_2$ is the conduction band minimum of the strained layer 14, $VBM_2$ is the valence band maximum of the strained layer 14, and IS indicates surface states. As can be seen from FIG. 7, the valence band maximum, $VBM_2$, of the strained layer 14 is at an energy level $Ev_1-Ev_2$ lower than the valence band maximum, $VBM_1$, of the substrate 12. On the other hand, the conduction band maximum, $CBM_2$, of the strained layer 14 is at an energy level by $Ec_2-Ec_1$ higher than the conduction band minimum, $CBM_1$, of the substrate 12. The band gap of the semiconductor substrate with the surface layer structure widens to the left side in FIG. 7. Surface states, IS exist at energy levels lower than the valence band maximum, $VBM_1$, of the substrate 12 due to the band gap expanding effect which results from the compression stress given by the strained layer 14. In other words, when viewed from the side of the substrate, the surface states resonate with the valence band of the semiconductor substrate. As a result, in the actual surface, no pinning of the Fermi level takes place.

The substrate having the arrangement shown in FIG. 5 has an energy band structure substantially the same as that illustrated in FIG. 7.

Figure 1:
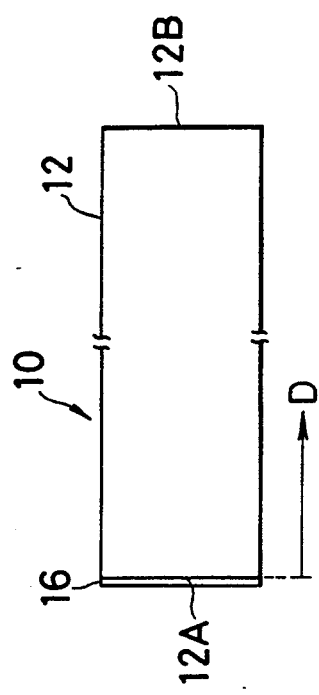
FIG. 1 is a schematic cross sectional view showing a conventional GaAs semiconductor substrate.
Figure 2:
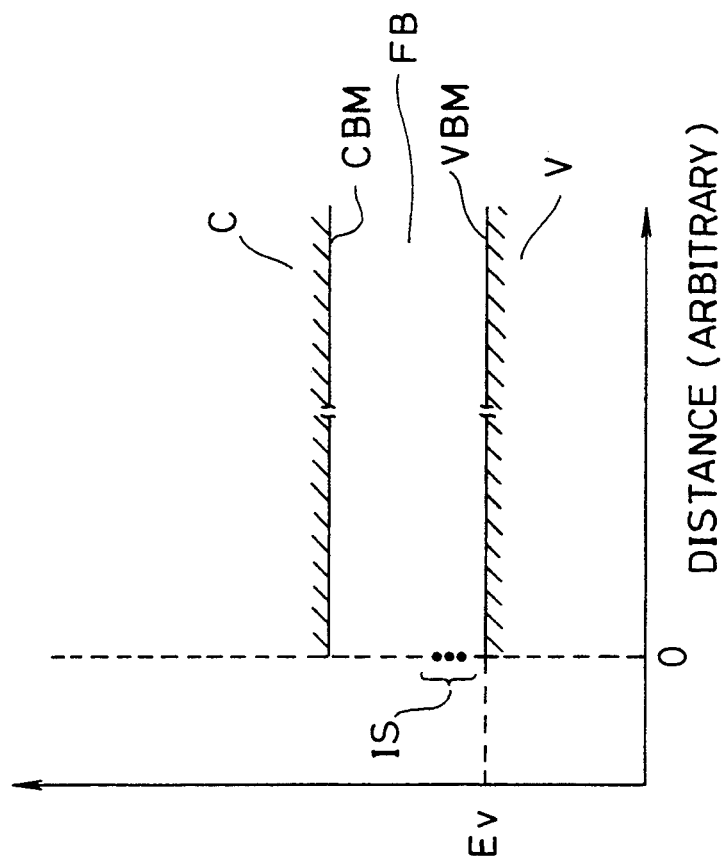
FIG. 2 is a schematic energy band diagram illustrating the energy band of the cross section of the GaAs semiconductor substrate shown in FIG. 1.
Figures 3, 4:
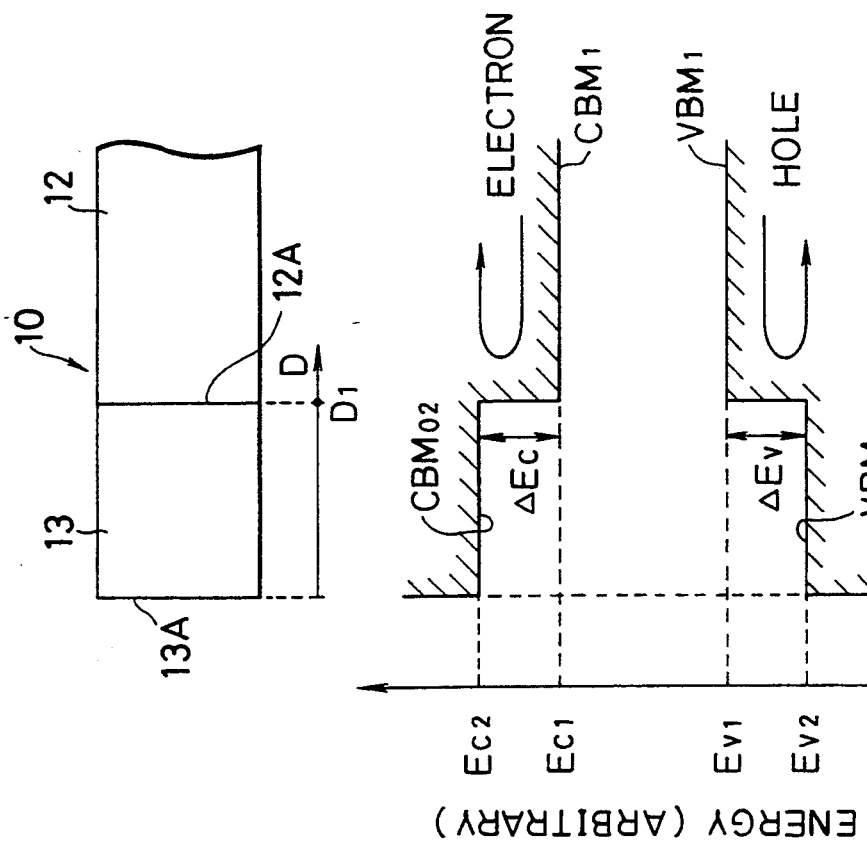
FIG. 3 is a schematic cross sectional view showing a conventional semiconductor substrate with a surface layer structure having a thick wide band gap material layer.
FIG. 4 is a schematic energy band diagram illustrating the energy band of the cross section of the conventional semiconductor substrate shown in FIG. 3.

The surface layer structure having the aforementioned energy band structure can be fabricated by epitaxially growing a strained layer composed essentially of at least one element selected from the group consisting of In, Ga, Al, and B, and at least one element selected from the group consisting of As and P, such as InGaP, InGaAs, InGaAsP, InGaAlAs, InAlAs, AlGaAs, BP or GaAs, on a semiconductor substrate having a composition represented by formula (I) above. Here, the conditions under which the valence band maximum $VBM_1$, of the substrate is higher than the valence band maximum, $VBM_2$, of the strained layer can be set up with reference to the teachings of H. Hasegawa, et al., J. Vac. Sci. Technol. B., vol. 4, No. 4, July/August 1986, esp. FIG. 3, etc.

Figure 8:
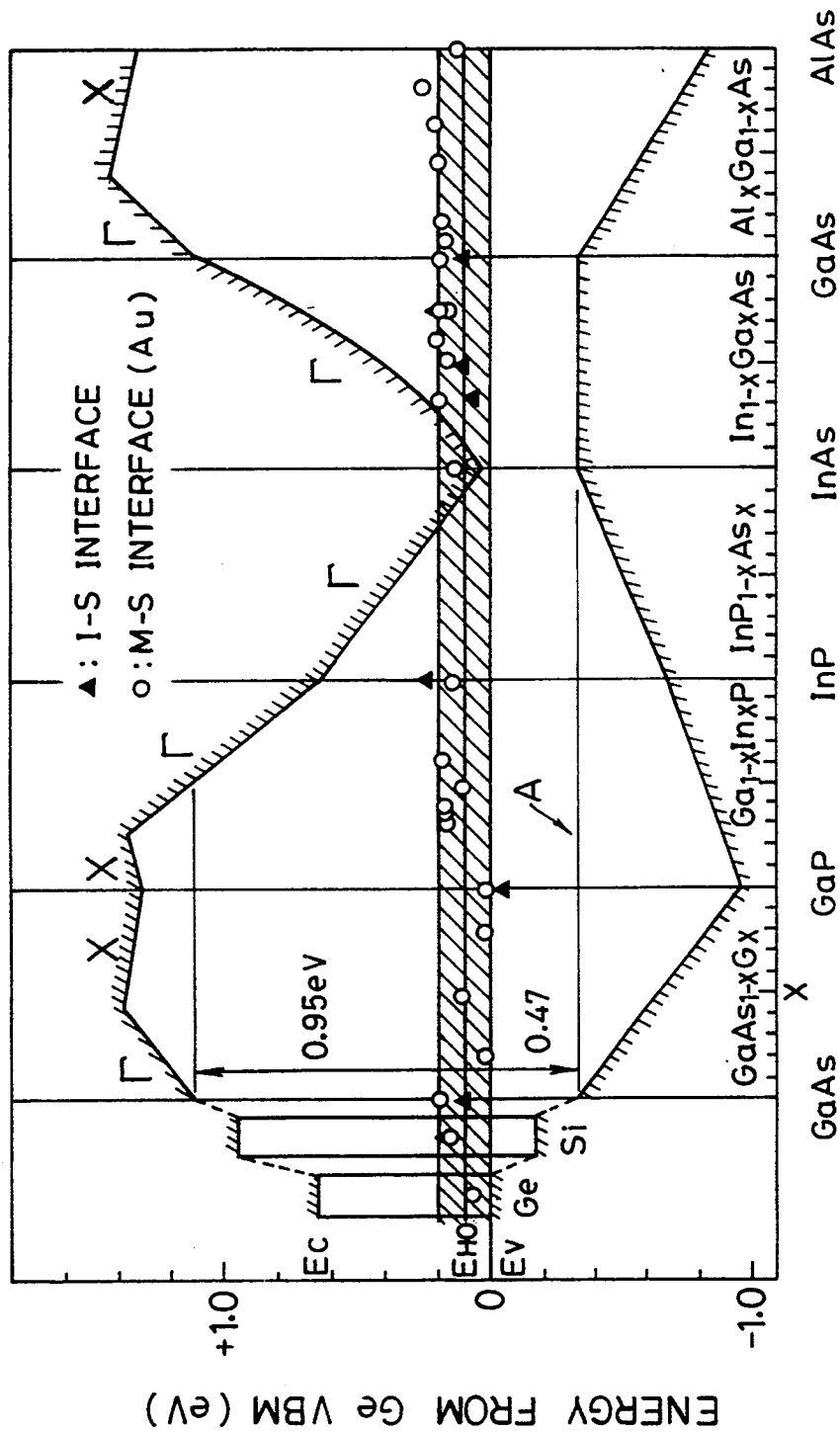
FIG. 8 is a graph showing published heterojunction band lineup data.

FIG. 8 is a graph showing published heterojunction band lineup data corresponding to FIG. 3 in H. Hasegawa, et al., J. Vac. Sci. Technol. B., vol. 4, No. 4, July/August 1986. In FIG. 8, Ev, Ec, and $E_{HO}$ stand for the energy level of the valence band maximum, energy level of the conduction band minimum, and empirical characteristic energy of the host substrate expressed on an absolute energy scale, respectively. In the case of, for example, a GaAs substrate, Ev is 0.47 eV lower than $E_{HO}$, while Ec is 0.95 eV higher than $E_{HO}$. As explained later on, when surface states, IS are present on the side of the valence band as illustrated in FIG. 7, the conduction band minimum, $CBM_2$ of the strained layer 14, does not have to be higher than the conduction band minimum, $CBM_1$ of the substrate 12. Therefore, it is sufficient that any desired composition of the strained layer may be selected which has a valence band maximum, $VBM_2$ below the level indicated by line A in FIG. 8. In the same manner as above, strained layers having various compositions, respectively, may be combined with semiconductor substrates having various compositions provided the energy band conditions of the present invention are satisfied, i.e., that the valence band maximum of the strained layer is at an energy level lower than that of the valence band maximum of the substrate.

Figures 9A, 9B, 9C, 9D:
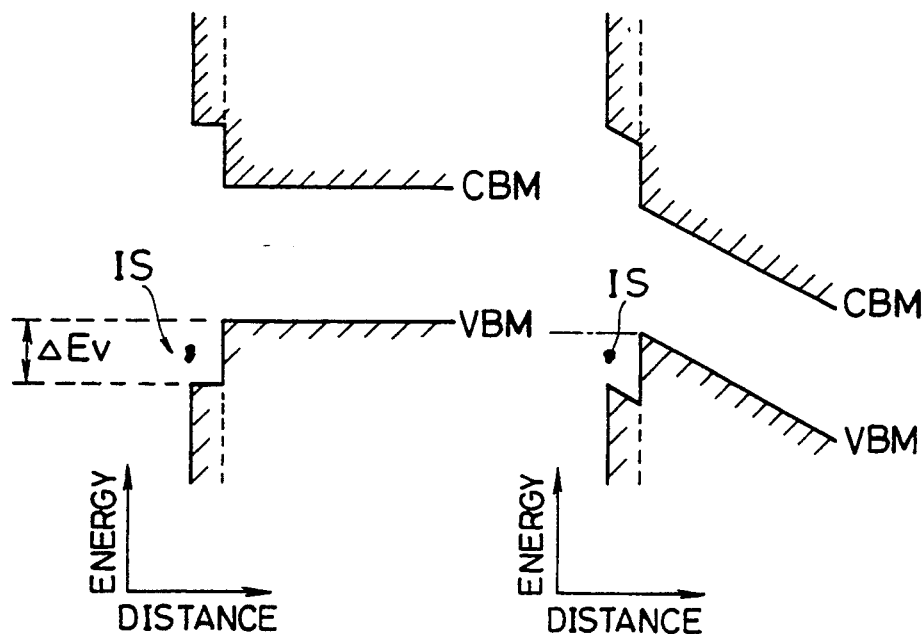
FIG. 9A is a schematic energy band diagram illustrating the energy band of a semiconductor substrate with a surface layer structure having a strained layer in accordance with the present invention, when the strained layer has a smaller thickness without a high electric field being applied.
FIG. 9B is a schematic energy band diagram illustrating the energy band of a semiconductor substrate with a surface layer structure having a strained layer in accordance with the present invention, when the strained layer has a smaller thickness with a high electric field being applied.
FIG. 9C is a schematic energy band diagram illustrating the energy band of a semiconductor substrate with a surface layer structure having a strained layer in accordance with the present invention, when the strained layer has a greater thickness without a high electric field being applied.
FIG. 9D is a schematic energy band diagram illustrating the energy band of a semiconductor substrate with a surface layer structure having a strained layer in accordance with the present invention, when the strained layer has a smaller thickness with a high electric field being applied.

FIG. 9A is a schematic energy band diagram illustrating the energy band of a semiconductor substrate with a surface layer structure having a strained layer in accordance with the present invention, when the strained layer has a smaller thickness, namely ultrathin thickness, without a high electric field being applied. FIG.

9B is a schematic energy band diagram illustrating the energy band of a semiconductor substrate with a surface layer structure having a strained layer in accordance with the present invention, when the strained layer has a smaller thickness with a high electric field being applied. FIG. 9C is a schematic energy band diagram illustrating the energy band of a semiconductor substrate with a surface layer structure having a strained layer in accordance with the present invention, when the strained layer has a greater thickness without a high electric field being applied. FIG. 9D is a schematic energy band diagram illustrating the energy band of a semiconductor substrate with a surface layer structure having a strained layer in accordance with the present invention, when the strained layer has a greater thickness with a high electric field being applied. Here, for the sake of simplification of explanation, an assumption has been made that the valence band maximum and conduction ban minimum of a surface layer vary linearly. Also, another assumption has been made that the concentration of impurities in the surface layer is the same as that of the impurities in the substrate. In other words, when an electric field is applied, the conduction band minimum and the valence band maximum of the substrate, and the conduction band minimum and valence band maximum of the surface layer can be expressed by lines, respectively, parallel to each other. As illustrated in FIG. 9D, when the surface layer is a thick layer, the surface states will appear in the band gap of the substrate under a high electric field. However, when the surface layer is very thin, the occurrence of surface states in the band gap of the substrate can be avoided even when an external electric field is applied.

In order to accomplish this, the thickness of the strained layer should preferably satisfy the following conditions. That is, the energy level of the surface states, IS should be lower than the energy level of about $E_{v1} - \Delta E_v$ (where $\Delta Ev = Ev_1 - Ev_2$). Here, the aforementioned condition stands for a threshold at which half the surface state density appears in the band gap of the substrate; this condition can be obtained by making an assumption that there is a uniform surface state density in the region of $\Delta Ev$.

Accordingly, when the substrate is made of GaAs, and it is assumed that conditions under which the energy level, $Ev_2$, of the surface of the strained layer is lower than the energy level, $Ev_2$, of the GaAs substrate, that is, the strained layer is made of, for example, GaP, then $\Delta Ev$ must be about 0.6 eV. Hence, taking into consideration application to devices and assuming an electric field of 1 MV/cm, (a permissible limit not inducing any avalanche breakdown), is applied, the very thin strained layer must be at most 3 nm. Further, when fabricating actual semiconductor devices, the thickness of the very thin strained layer may be set up somewhat greater so that it can endure an electric field on the order of 2 MV/cm, adding some allowance. In this case, the very thin strained layer need have a thickness of 1.5 nm or smaller. Hereinafter, the very thin strained layer will sometimes be referred to as an ultrathin layer or simply as thin layer.

Figure 10:
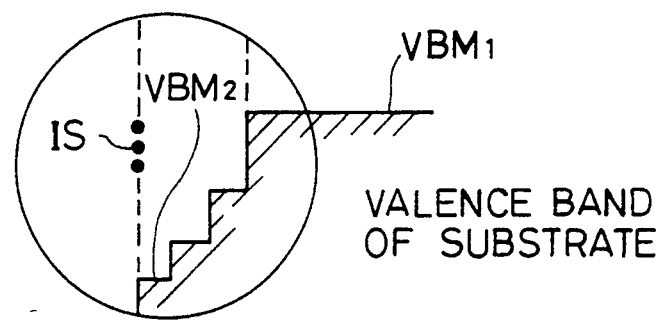
FIG. 10 is an enlarged view of a portion of the energy band diagram shown in FIG. 7.

FIG. 10 is an enlarged view of a portion of the energy band diagram illustrated in FIG. 7. In FIG. 7, the symbols IS, $VBM_1$ and $VBM_2$ are the same as in FIG. 7. While in the energy band diagram illustrated in FIG. 7, the energy of the valence band maximum $VBM_2$ of the strained layer 14 has been illustrated as decreasing as it moves away from the crystalline semiconductor substrate, this is not mandatory. Also, the valence band of the strained layer 14 does not have to be continuously smooth but may vary stepwise down to the valence band maximum $VMB_2$ as illustrated in FIG. 10.

On the contrary, in the energy band diagram illustrated in FIG. 7, the conduction band minimum $CBM_2$ of the strained layer has been illustrated as becoming elevated toward the surface 14A of the strained layer 14. However, this is not mandatory. For example, supposing that a thick InP heterojunction of InP/GaAs is fabricated based on the concept of band lineup (though not achievable in actuality due to strain), the energy of the conduction band minimum of GaAs will be lower than the energy of the conduction band minimum of InP overlying the GaAs. In contrast, in the case of the thin strained layer as used in the present invention, the energy level of the conduction band is considered to remain at an almost constant level due to strain, thus forming no electron states which would otherwise be formed on the surface by quantum wells.

Figure 11:
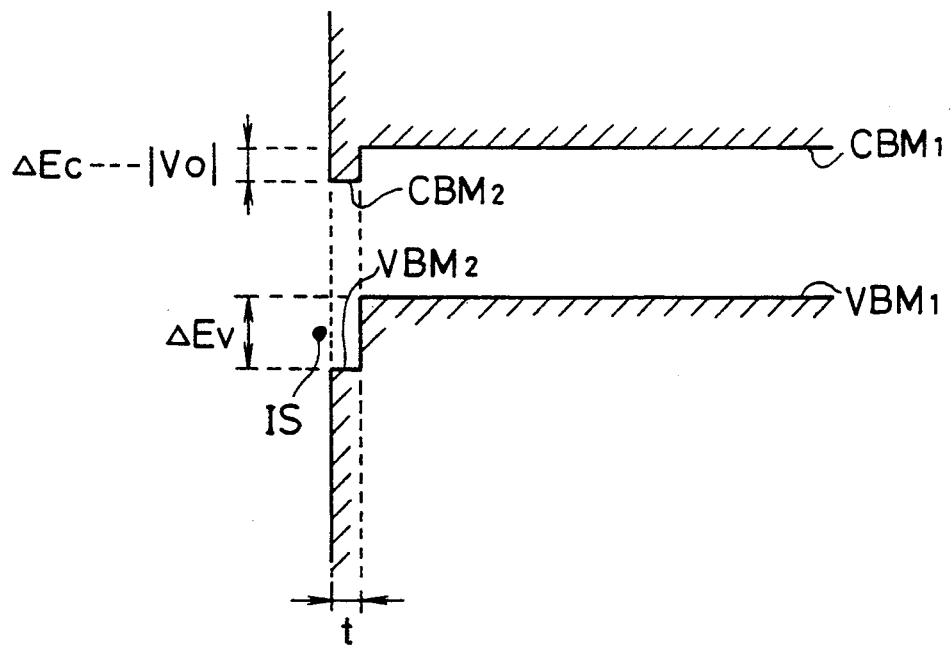
FIG. 11 is a schematic energy band diagram illustrating the energy band of a semiconductor substrate with a surface layer structure having a strained layer in accordance with the present invention, when a quantum well is formed on the surface thereof.
Figure 12:
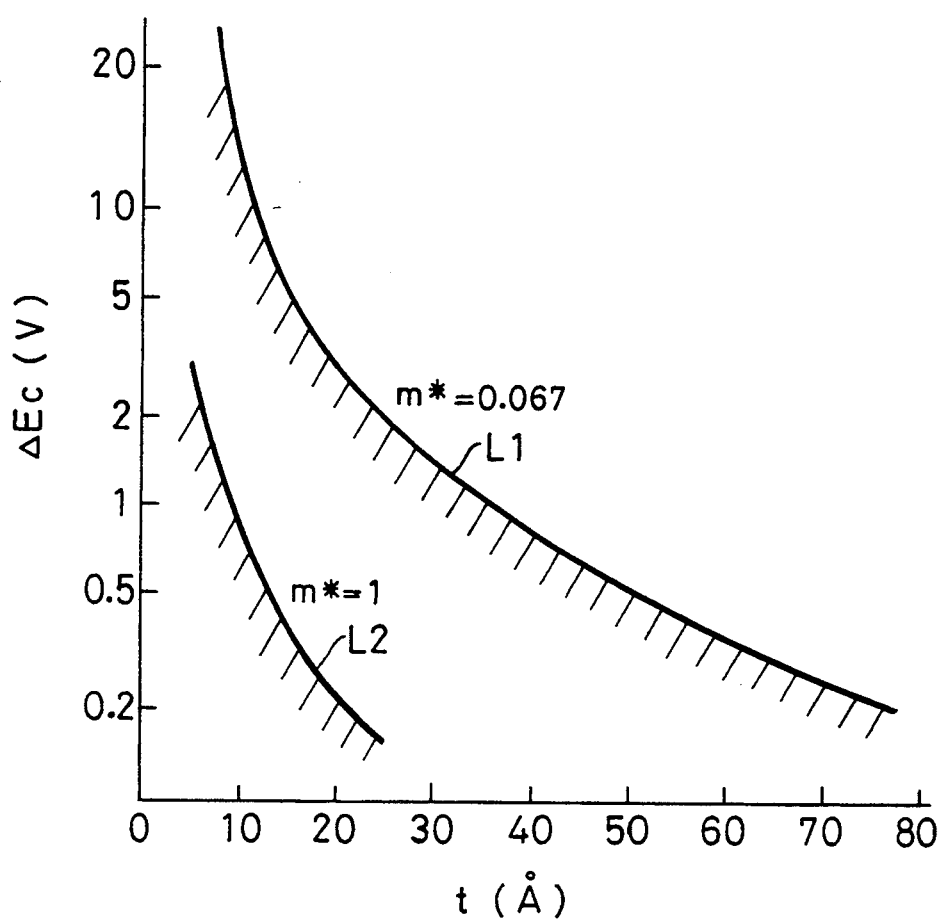
FIG. 12 is a graph plotting results of quantum mechanical calculations on the conditions under which surface states appear in the quantum well shown in FIG. 11.

FIG. 11 is a schematic energy band diagram illustrating the energy band of a semiconductor substrate with a surface layer structure having a strained layer in accordance with the present invention, when a quantum well is formed on the surface of the strained layer FIG. 12 is a graph plotting results of quantum mechanical calculations on the conditions under which surface states appear in the quantum well formed in the conduction band in the vicinity of the surface shown in FIG. 11. In FIG. 11, symbols $CBM_1$, $CBM_2$, $VBM_1$, $VBM_2$, and IS are the same as in FIGS. 4 and 7. In FIG. 12, symbol m* stands for effective mass of electron, and L1 and L2 indicate curves showing extremities of conditions where electrons can exist at energy levels equal to or higher than the energy level of the conduction band minimum of the substrate even when $\Delta Ec = 0.3$ eV, for $m^* = 0.067$ and for $m^* = 1$, respectively. FIG. 12 indicates that when the thickness of the surface layer is small, surface states do not appear at energy levels lower than the conduction band minimum of the substrate. For example, when the thickness of the surface layer, t, and effective mass of an electron, m*, satisfy the following relation:

t < 15 (Angstroms), and
m = 1, then electrons can be present at energy levels equal to or higher than the energy level of the conduction band minimum of the substrate even when $\Delta Ec = 0.3$ eV. In other words, in the hatched region below curve $L_1$ ($m^* = 0.067$) or $L_2$ ($m^* = 1$) surface states are allowed to exist only at energy levels equal to or higher than the energy level of the conduction band minimum, $CBM_1$ of the substrate. Therefore, in the case where surface states are present on the side of the valence band (as illustrated in FIG. 7, which conditions are met in the arrangement according to the present invention), the conduction band minimum, $CBM_2$, of the ultrathin layer (strained layer) does not have to exceed the conduction band minimum, $CBM_1$, of the substrate.

Figure 13:
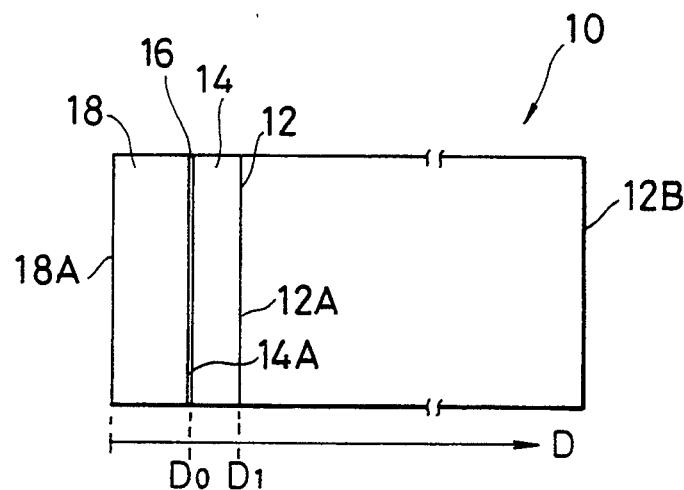
FIG. 13 is a schematic cross sectional view showing a semiconductor substrate with a surface layer structure having an insulator layer in accordance with an embodiment of the present invention.
Figure 14:
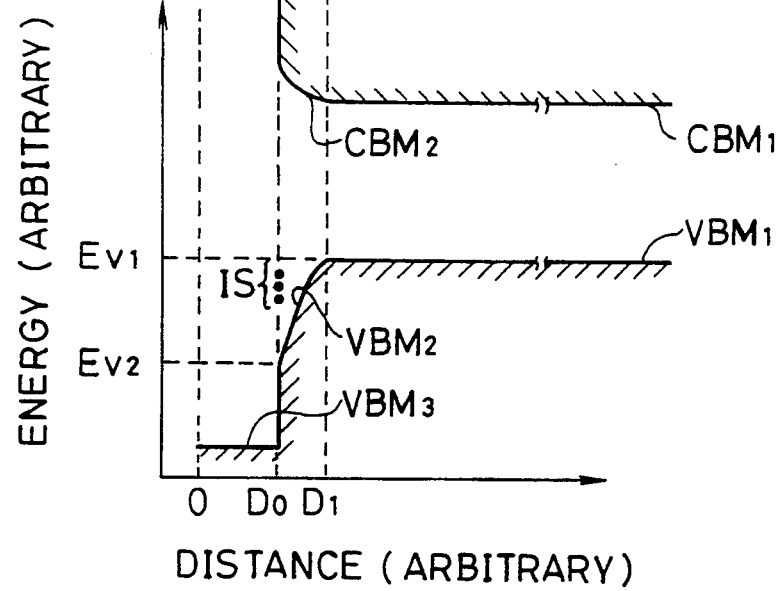
FIG. 14 is a schematic energy band diagram illustrating the energy band of the semiconductor substrate shown in FIG. 13.

Next, the arrangement of a semiconductor substrate with a surface layer structure will be explained in accordance with the above described embodiment of the present invention which had the covering layer provided on the surface of the strained layer. FIG. 13 is a schematic cross sectional view showing a semiconductor substrate with a surface layer structure having an insulator layer in accordance with an embodiment of the present invention. FIG. 14 is a schematic energy band diagram illustrating the energy band of the semiconductor substrate shown in FIG. 13. In FIG. 13, reference numerals 10, 12, 12A, 12B, 14, 14A, and 16 are the same as in FIGS. 5 and 6, and 18 denotes an insulator layer, symbols D and $D_1$ are the same as in FIG. 6, and symbol $D_0$ indicates distance of the interface 14A of the strained layer 14 from the surface 18A of the insulator layer 18. In the arrangement shown in FIG. 13, the insulator layer 18 is formed on the covering layer 16 which in turn is provided on the strained surface 14.

The aforementioned semiconductor substrate with a surface layer structure according to the present invention can be fabricated by forming a very thin layer of a compound semiconductor layer on a semiconductor substrate by an appropriate deposition technique such as organic chemical vapor deposition (MOCVD) or molecular beam epitaxy. Thereafter, if desired, the resulting structure may be exposed to a high temperature of 400° to 650° C. in the presence of a partial pressure of P or S to form a covering layer on the very thin layer, and then a layer of SiO or $SiO_2$ may be deposited on the covering layer by a conventional vapor deposition method or a conventional ECR plasma CVD method, respectively. In FIG. 14, symbols $CBM_1$, $CBM_2$, $VBM_1$, $VBM_2$, $D_0$, $D_1$, Ev1, Ev2 and IS are the same as in FIGS. 7 and 13, and $CBM_3$ denotes the conduction band minimum of the insulator layer 18, and $VBM_3$ denotes the valence band maximum of the insulator layer 18. As illustrated in FIG. 14, the band gap of the strained layer 14 is wider than that of the semiconductor substrate 12. Further, the band gap of the insulator layer 18 is wider than that of the strained layer 14. Thus, surface (interface) states IS are at energies lower than the valence band maximum $VBM_1$ of the substrate 12.

Figure 15:
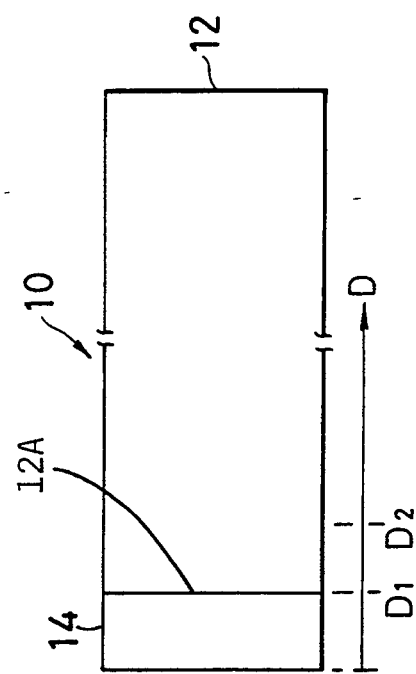
FIG. 15 is a schematic cross sectional view showing a semiconductor substrate with a surface layer structure having an insulator layer in accordance with an embodiment of the present invention.
Figure 16:
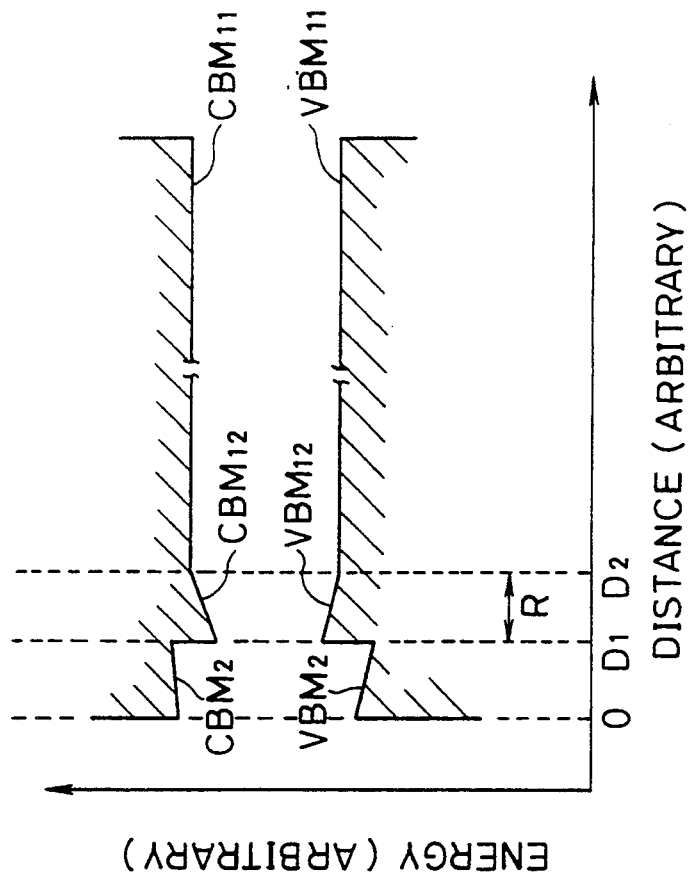
FIG. 16 is a schematic energy band diagram illustrating the energy band of the semiconductor substrate shown in FIG. 15.

FIG. 15 is a schematic cross sectional view showing a semiconductor substrate with a surface layer structure having an insulator layer in accordance with an embodiment of the present invention. In FIG. 15, reference numerals 10, 12, and 14, and symbols D and $D_1$ are the same as in FIG. 13, and symbol $D_2$ stands for the distance of an extremity of the region in the substrate 12, wherein the region has a band gap influenced by the strained layer 14 overlying it. FIG. 16 is a schematic energy band diagram illustrating the energy band of the semiconductor substrate shown in FIG. 15. In FIG. 16, symbols $D_1$ and $D_2$, $CBM_2$ and $VBM_2$ are the same as in FIG. 7 and 14, and symbol $CBM_{11}$ stands for conduction band minimum of the substrate 12 under no strain, $CBM_{12}$ stands for the conduction band minimum of the substrate 12 under influence of the strained layer 14, $VBM_{11}$ stands for the valence band maximum under no strain, $VBM_{12}$ stands for the valence band maximum under influence of the strained layer 14, and R is a region of the substrate 12 where effects of the strain given by the strained layer 14 can be observed. As will be understood from FIG. 15 and FIG. 16, the provision of the strained layer 14 on the substrate 12 gives rise to a stress to the substrate 12 in the vicinity of the interface 12A, and this stress renders the band gap in a region up to the surface 12A of the substrate (distance from $D_2$ to $D_1$) somewhat narrower as compared with the substrate 12 without the strained layer. That is, the band gap or difference between the conduction band minimum, $CBM_{12}$, and the valence band maximum, $VBM_{12}$, of the substrate 12 in a region R in the vicinity of the surface (interface) 12A thereof is somewhat smaller than the gap between the conduction band minimum, $CBM_{11}$, and the valence band maximum, $VBM_{11}$, of the substrate 12 sufficiently remote from the surface 12A of the substrate 12. Of course, the band gap between the conduction band minimum, $CBM_2$, and the valence band maximum, $VBM_2$, of the strained layer 14 is always wider than the band gap of the substrate.

This is because although use is made of compression stress caused by lattice mismatching between the InP type ultrathin layer and the substrate, it sometimes happens that the lattice mismatching gives rise to stress not only on the ultrathin layer 14 but also on the substrate. This reduces the width of the band gap of the substrate, particularly in the vicinity of the interface 12A, if the composition and thickness of the strained layer 14 have been selected inappropriately.

According to the present invention, a further improvement in this respect can be made as follows. That is, first an ultrathin layer of a semiconductor is formed on a GaAs substrate or a GaAs type mixed crystal substrate. This ultrathin layer has lattice constants equal to or smaller than those of the substrate and a band gap wider than that of the substrate. Next, another semiconductor deposit is formed on the first deposit. This addition or second deposit has a composition different from that of the first deposit such that the lattice constants of the second deposit are greater than those of the first deposit, the band gap width of the uppermost layer or second deposit can be wider than that of the substrate even under the stress caused by the difference in lattice constants between the first and second deposits, and the valence and conduction bands of the ultrathin layer (first and second deposit) will not fall in the band gap of the substrate. Here, the ultrathin layer is composed of the first and second deposits, thus forming a strained multi-layer structure. This structure can vary continuously in composition or with making a clear interface. In other words, the surface layer structure according to the instant embodiment includes a semiconductor substrate and an ultrathin layer of a semiconductor epitaxially grown on the surface of the substrate and having a band gap wider than that of the semiconductor substrate, the ultrathin layer having a lattice strain and being composed of a semiconductor material having lattice constants equal to or smaller than those of the substrate in one portion positioned on the side of the substrate and of another semiconductor material having lattice constants greater than those of the substrate-side portion in the other portion positioned on the side of the surface of the ultrathin layer (strained layer).

Figures 17, 18:
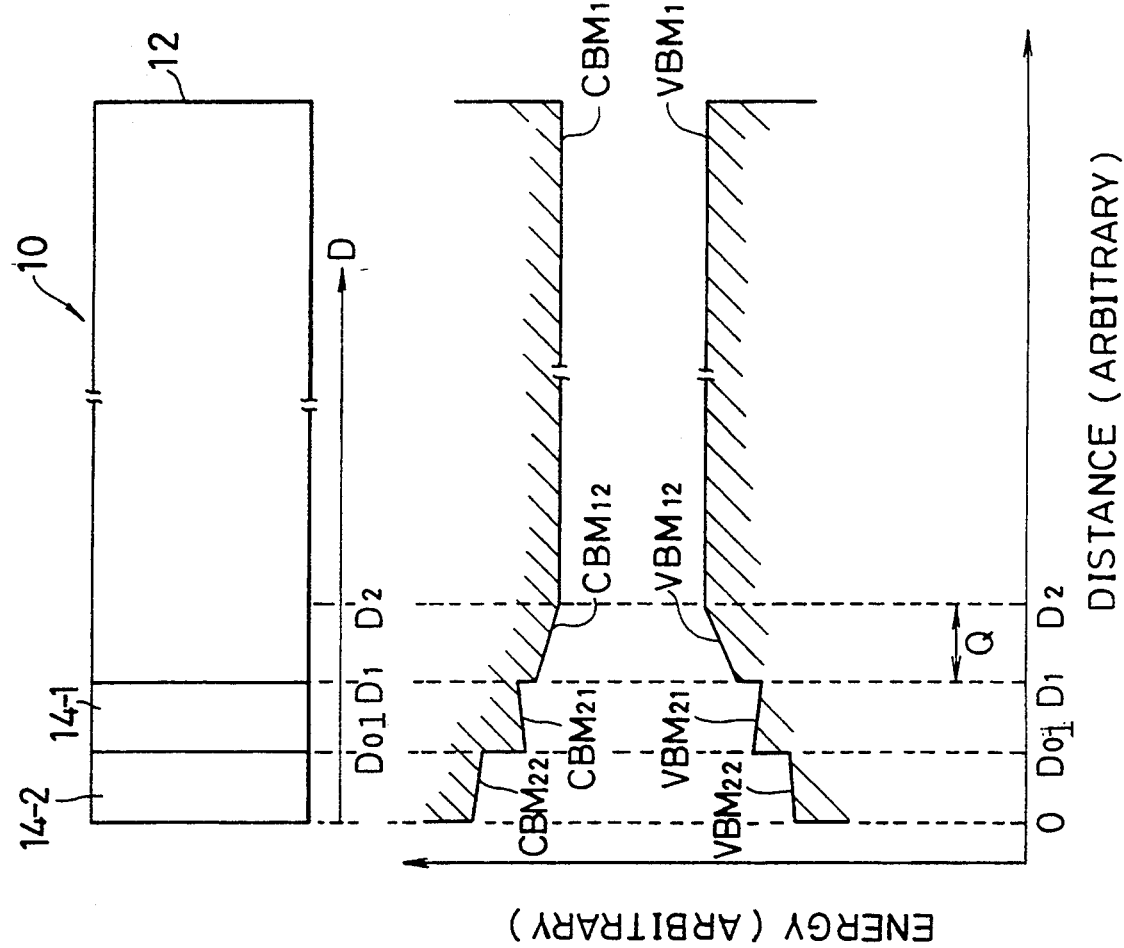
FIG. 17 is a schematic cross sectional view showing a compound semiconductor substrate with a surface layer structure having a bi-layer strained layer in accordance with an embodiment of the present invention.
FIG. 18 is an energy band diagram illustrating the energy band of the semiconductor substrate with the surface layer structure having a strained layer shown in FIG. 17, with the strained layer giving a compression stress to the surface of the semiconductor substrate to widen the band gap.

Next, the surface layer structure of a compound semiconductor having the aforementioned multi(bi)-layer strained layer will be explained in greater detail hereinbelow with reference to FIGS. 17 and 18. FIG. 17 is a schematic cross sectional view showing a compound semiconductor substrate with a surface layer structure having a strained layer in accordance with an embodiment of the present invention. FIG. 18 is an energy band diagram illustrating the energy band of the semiconductor substrate with the surface layer structure having a strained layer as shown in FIG. 17. In FIG.: 17, 12 denotes a GaAs substrate, 14-1 a first subunit layer (tensile-strained layer), and 14-2 a second subunit layer, and symbols D, $D_1$ and $D_2$ are the same as in FIG. 15, and $D_{01}$ denotes distance of the interface between the tensile-strained layer 14-1 and the compression-strained layer 14-2. In FIG. 18, symbol Q denotes a region where a compression stress is given by the strained layer (first subunit layer 14-1) to the surface 12 of the semiconductor substrate to widen its band gap, symbols $D_1$, $D_2$, $CBM_{11}$, $CBM_{12}$, $VBM_{11}$, $VBM_{12}$ are the same as in FIG. 7 and 15, and symbol $CBM_{21}$ stands for the conduction band minimum of the first subunit layer 14-1, $CBM_{22}$ stands for the conduction band minimum of the strained layer 14-2, $VBM_{21}$ stands for the valence band maximum of the first subunit layer 14-1, and $VBM_{22}$ stands for the valence band maximum of the second subunit layer 14-2.

Here, the term "hetero-epitaxial layer" or "hetero-epitaxially grown layer" refers to a layer having a composition different from that of the substrate but having the same crystal system as the substrate and the same direction in crystal lattice as the substrate. The "lattice constants" referred to herein are values for a crystal under no stress.

In the arrangement shown in FIG. 17, the first subunit strained layer or tensile-strained layer 14-1 is formed on the GaAs substrate 12. On the tensile-strained layer 14-1 is provided the second subunit strained layer or compression-strained layer 14-2. That is, the strained layer 14 in this embodiment is divided into two subunit layers, the tensile-strained layer 14-1 and the compression-strained layer 14-2. The portion of the strained layer (ultrathin layer) 14 closer to the substrate, i.e., tensile-strained layer 14-1, is composed of a semiconductor which has lattice constants equal to or smaller to those of the substrate 12. This construction is intended to control the effect of stress exerted by the ultrathin layer on the energy band structure of the substrate. More particularly, the provision of the first subunit layer avoids a stress which would otherwise appear in a region in the vicinity of the surface of the substrate and this surface is in contact with the strained layer, or gives rise to a compression stress to that region. As a result, the valence and maximum and conduction band minimum on the surface of the substrate are not shifted or the gap therebetween is widened so that they are outside the band gap of the substrate at a portion sufficiently remote from the interface 12A of the substrate 12 or a portion of the substrate 12 free of the influence of the stress given by the first subunit layer 14-1, as illustrated in FIG. 18. By bringing the tensile-strained layer 14-1 on the surface of the substrate 12A in contact with the substrate, the valence band maximum and conduction band minimum in the region Q (FIG. 18) in the vicinity of the surface of the substrate 12 are prevented from being shifted into the forbidden band beyond the corresponding valence band maximum and conduction band minimum of the substrate in a region remote from the surface or interface 12A of the substrate and where no strain is present. Or, by contacting the strained layer with the substrate indirectly, e.g., through a layer of a different III-V compound semiconductor which layer has a band gap wider than that of the substrate, the lattice of which layer is matched with that of substrate, the surface of the substrate is prevented from undergoing changes in its valence band maximum and conduction band minimum. As a result, an abnormal or undesired accumulation of carriers which would appear in the vicinity of the surface of the substrate in the absence of the aforementioned strained multi-layer as indicated by symbol R in FIG. 16 can be prevented. In addition, the lattice constants of the second subunit layer 14-2 are provided on the tensile-strained layer 14-1. In contrast to the layer 14-1, the second subunit layer 14-2, which is uppermost and serves as a strained layer, has lattice constants greater than the underlying layer 14-1. This gives rise to a compression stress in the layer 14-2 itself, to form an energy band structure with the band gap of the strained layer wider than the inherent band gap thereof (band gap under no stress). Hence, there is, over a distance from the surface of the second subunit layer 14-2 to the depth of the substrate, no band gap that is narrower than the inherent band gap of the substrate. This enables fabrication of an ultrathin layer of a semiconductor having a band gap wider than that of the substrate on the surface of the substrate while taking advantage of the effect of stress.

As a result, only a region of low surface state density energy level of the ultrathin semiconductor layer is present having a low surface state density, i.e., only a region of energy level of the ultrathin layer corresponding to the inherent band gap (band gap under no stress) of the substrate, is present in effect.

As stated above, (1) provision of the hetero-epitaxially grown, ultrathin strained layer of a compound semiconductor on the substrate of a different compound semiconductor, in which the valence band maximum of the strained layer is at an electron energy level lower than the valence band maximum of the substrate, and (2) the presence of the ultrathin layer, permits transportation of carriers therethrough to the surface of the substrate by tunneling effect. From these, it follows that the pinning state can be buried in, i.e., rendered resonant with the valence band of the substrate. Thus, industrial application of the present invention includes passivation of the surface of semiconductors.

With respect to the inherent band gaps (band gaps under no stress) of the respective subunit layers, following conditions are important:

(1) The band gap of the ultrathin layer at the portion closer to the substrate must be wider than the band gap of the substrate. The reason for this is that the portion of the strained layer near the surface (interface) of the substrate, i.e., the first subunit layer, receives tensile stress, which makes the band gap of this portion narrower than that in the absence of stress, tending to form a band gap narrower than the band gap of the substrate.

(2) In the portion of the ultrathin layer near its surface (uppermost portion), the lattice constants are set up so that a compression stress is given and thus the band gap in this compression-strained region is rendered wider than the inherent band gap thereof. Hence it is not always necessary that the uppermost portion or the second subunit layer of the strained layer has an inherent band gap wider than the inherent band gap of the underlying portion or the first subunit layer. In both regions, care must be taken that no portion of the valence band or conduction band enter into the band gap of the substrate. The band diagram illustrated in FIG. 18 summarizes the aforementioned concept in designing the energy band structure.

Although the strained layer has been described above as being composed of two phases or subunit layers, it may be of multi-layer, e.g., tri-layer or more. Such a strained multi-layer structure can be obtained by providing finer intermediate structures between the aforementioned first and second subunit layers.

Figure 19A:
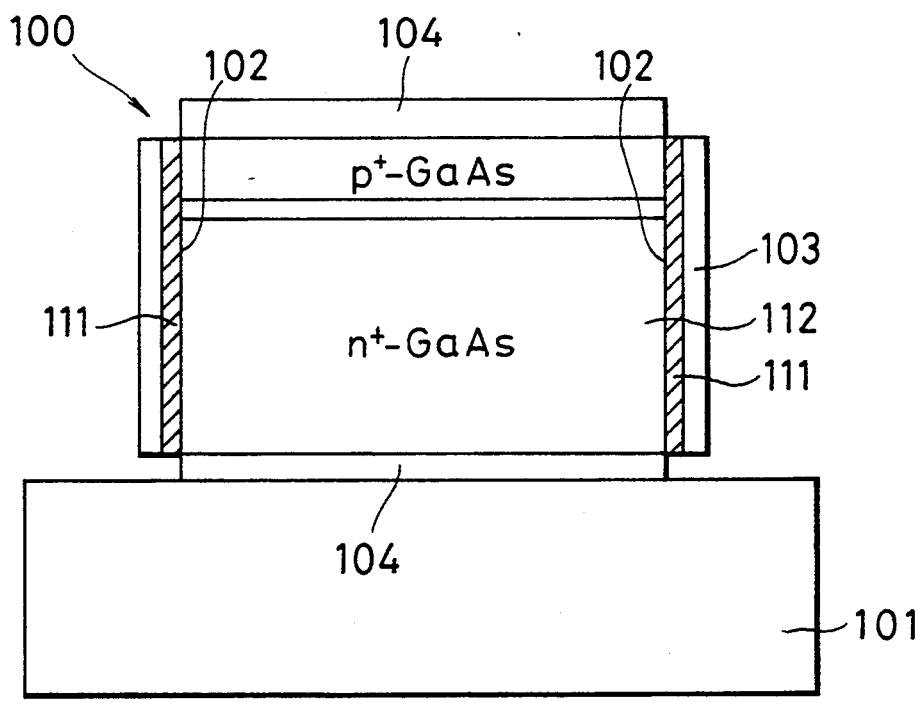
FIG. 19A is a schematic cross sectional view showing an example of GaAS diode laser including the semiconductor substrate of the present invention.

The semiconductor substrate of the present invention can be used in various semiconductor devices which include, for example, diode lasers, metal semiconductor field effect transistors (MESFET), heterojunction bipolar transistors (HBT), and the like. For example, diode lasers may include the surface layer structure of the present invention on one or both facets of the resonator. Field effect transistors (FET) may have the semiconductor substrate of the present invention. That is, FETs may have the surface layer structure of the present invention on the surfaces of the substrate between the source and the gate and between the gate and the drain, respectively. Further, heterojunction bipolar transistors may include the surface layer structure of the present invention as a surface passivation layer for pn junctions. FIG. 19A is a schematic cross sectional view showing an example of GaAS diode laser including the semiconductor substrate of the present invention. As shown in FIG. 19A, a diode laser 100 includes a semiconductor substrate 112 consisting of an n-GaAs layer, an active layer and a p-GaAs layer and electrodes. This structure is mounted on a heat sink 101 made of, for example, a metal coated silicon chip. The laser 100 has on both end facets 102, the surface layer structure 111 of the present invention and a protective layer 103. The electrodes 104 are provided on both surfaces of the semiconductor substrate 112 perpendicular to the end facets 102. The surface structure 111 of the invention may be, for example, the strained layer 14, or subunit layers 14-1 and 14-2, or a combination of the strained layer 14, or subunit layers 14-1 and 14-2, with the cover layer 16 (layer containing P, S or P in the state combined with oxygen). The semiconductor device having the surface layer structure of the present invention is improved with respect to deterioration of efficiency.

Figure 19B:
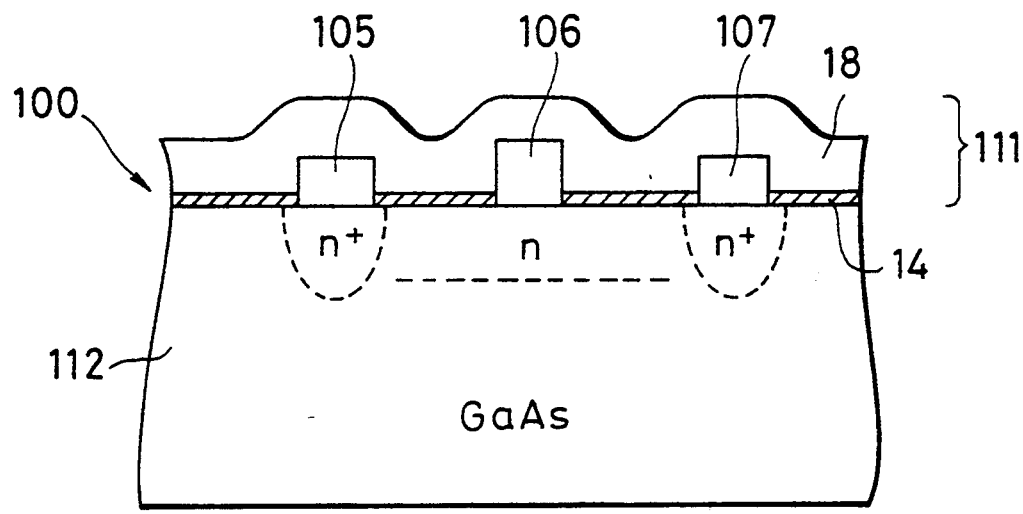
FIG. 19B is a schematic cross sectional view showing an example of a GaAs field effect transistor (FET) having the semiconductor substrate of the present invention.

FIG. 19B is a schematic cross sectional view showing an example of a GaAs field effect transistor (FET) having the semiconductor substrate of the present invention. As shown in FIG. 19B, a GaAs FET 100 has a semi-insulating GaAs substrate 112 which has a source 105, a gate 106 and a drain 107. On the surface of the substrate 112 is provided the surface layer structure 111 of the present invention in the form of a combination of the thin layer 14 (cf. FIG. 15) and the insulator layer (or encapsulant) 18 made of $SiO_2$ (cf. FIG. 13) between the source 105 and the gate 106 and between the gate 106 and the drain 107, respectively. The surface layer structure 111 may be a combination of the subunit layers 14-1 and 14-2 (cf. FIG. 17) with the encapsulant 18 and optionally the cover layer 16 (layer containing P, S or P in the state combined with oxygen) (cf. FIG. 13). The semiconductor device having the surface layer structure of the present invention has an improved transconductance and a lower noise figure than similar devices which have no such surface layer structure.

Figure 19C:
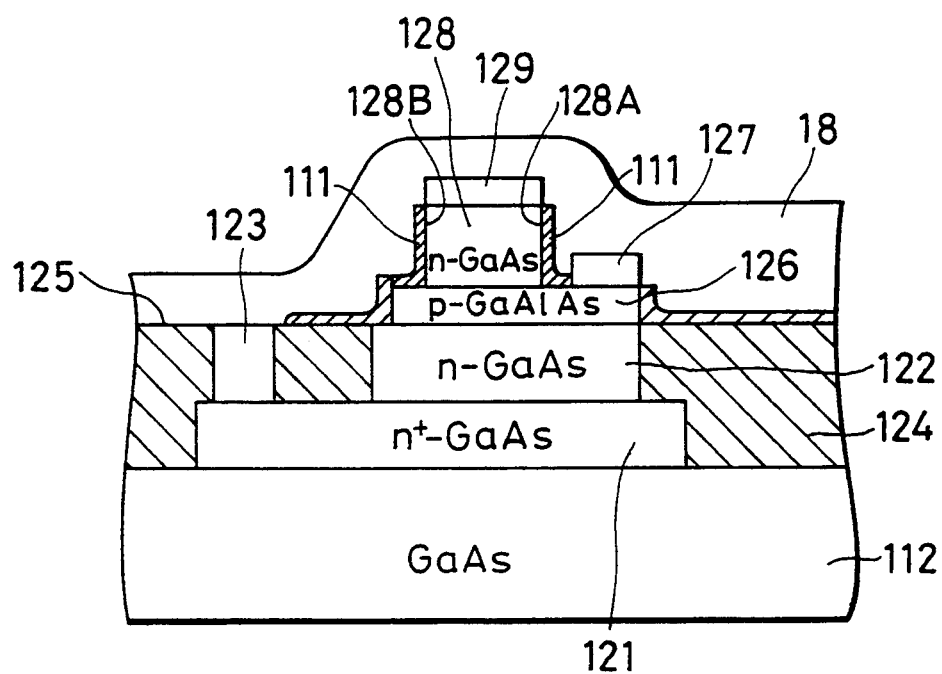
FIG. 19C is a schematic cross sectional view showing an example of a heterojunction bipolar transistor including the semiconductor substrate of the present invention.

FIG. 19C is a schematic cross sectional view showing an example of a heterojunction bipolar transistor including the semiconductor substrate of the present invention. As shown in FIG. 19C, a heterojunction bipolar transistor (HBT) 100' of the present invention includes an n+ GaAs layer 121 on the semiconductor substrate 112, and an n-GaAs layer 122 on the layer 121. On the n+-GaAs layer 121 are provided the n-GaAs layer 122 as a collector layer and a collector electrode 123. An oxygen-implanted insulating layer 124 is provided on these layers 121, 122 and 123 as well as on the substrate 112, so that a flat surface 125 is formed. A base layer 126 made of p-GaAlAs is formed on the collector layer 122, which in turn has thereon a base electrode 127. An emitter layer 128 made of n-GaAs is provided on the base layer 126 spaced apart from the base electrode 127. Further, an emitter electrode 129 is provided on the emitter layer 128. Both side surfaces 128A and 128B of the emitter layer 128 are provided with the surface layer structure 111 of the present invention in the form of the thin layer 14 (cf. FIG. 15) plus the encapsulant 18 (FIG. 13). The surface layer structure 111 extends onto a part of the surface of the base layer 126 and a part of the surface of the insulator layer 124. The surface layer structure 111 may be in other forms as described above. The semiconductor device having the surface layer structure provided so as to cover the p-n junctions of the HBT 100' has an improved current gain than similar devices that do not have the surface layer structure of the present invention.

The aforementioned semiconductor devices having the surface layer structure of the present invention can be fabricated by forming various elements of the device on the semiconductor substrate of the present invention in the conventional manner or by forming the surface layer structure on a selected surface or surfaces of a semiconductor device or element fabricated in advance in a conventional manner. In the latter case, the formation of the surface layer structure on selected regions of the surface a semiconductor device can be carried out in substantially the same manner as in the case of forming the surface layer structure on a semiconductor substrate.

Next, the formation of the surface layer structure of the present invention on a semiconductor substrate will be explained.

Figure 20:
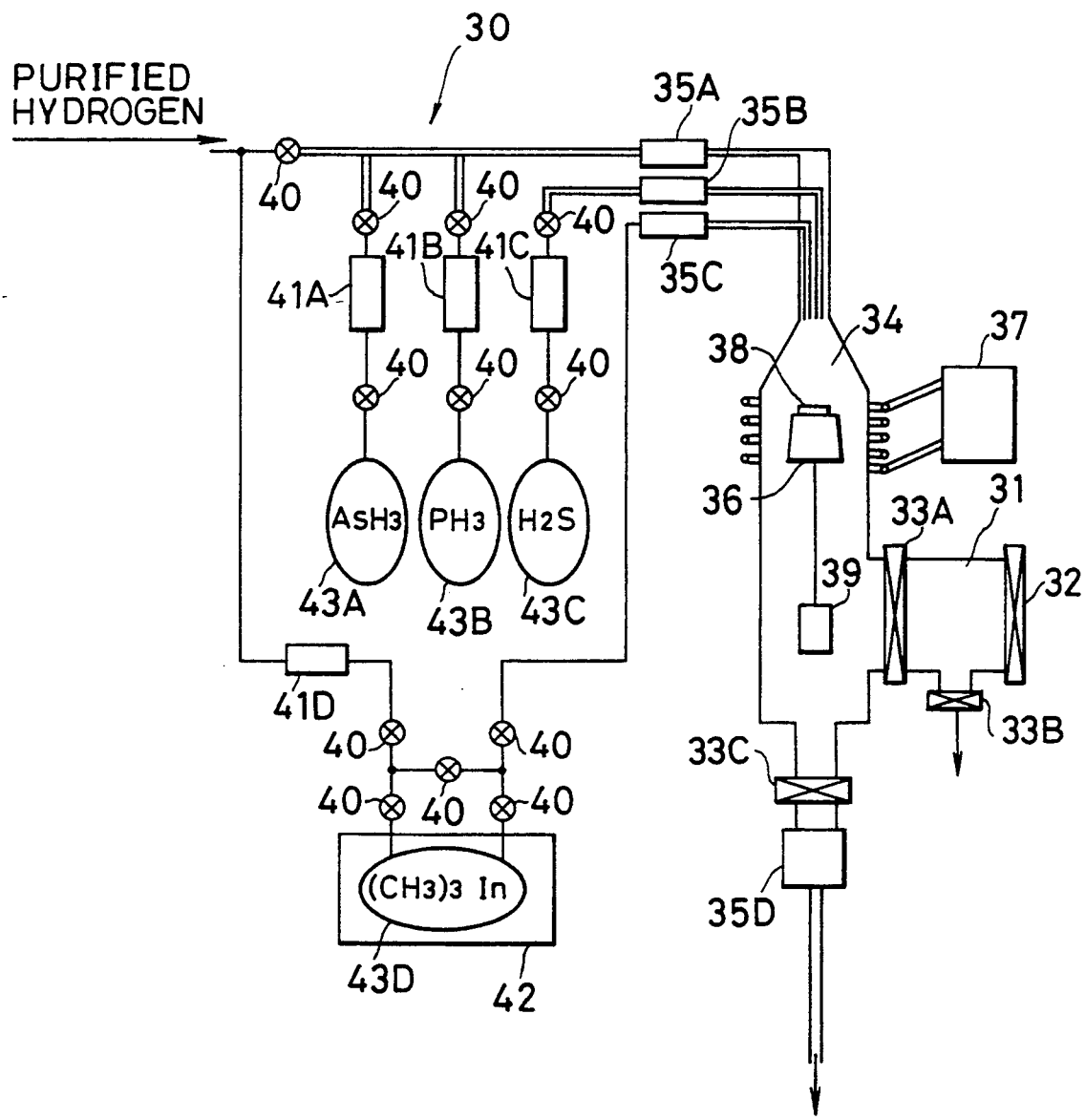
FIG. 20 is a block diagram showing a schematic arrangement of an apparatus for surface treatment used in the present invention.

Referring to FIG. 20, fabrication of an example semiconductor substrate composed of GaAs having the surface layer structure according to the present invention will be explained. FIG. 20 is a block diagram showing a schematic arrangement of an apparatus for surface treatment used in the present invention. In FIG. 20, reference numeral 30 denotes a surface treatment apparatus, 31 a specimen exchange chamber for exchanging specimens, 32 a valve for exchanging specimens, 33A, 33B and 33C valves for sealing, respectively, 34 a treatment chamber (CVD reactor) made of quartz glass for treating a specimen, 35A, 35B, 35C and 35D pressure control devices for controlling the pressures of the treatment chamber, 36 a carbon susceptor, 37 a temperature control device, or RF oscillator, for controlling the temperature of the specimen, 38 a specimen, 39 a specimen exchange device for exchanging the specimen, 40 a gas control valve for controlling a gas, 41A, 41B, 41C and 41D a flow rate control device, or mass flow controller, for controlling the flow rate of the gas for treating the specimen, 42 is a thermostat for trimethylindium (TMI), and 43A–43D are cylinders for storing starting material gases.

As shown in FIG. 20, the surface treatment apparatus 30 which can be used in the present invention includes the treatment chamber 34, in which the susceptor 36 and the specimen exchange device 39 are arranged. On the susceptor 36 is mounted the specimen. The treatment chamber 34 is connected to the specimen exchange chamber 32 through the valves 33 and 33A for sealing the treatment chamber. The specimen exchange valve 32 is attached to the specimen exchange chamber 31. Upon exchanging the specimens, the valve 32 or 33 is opened or closed in order to seal the CVD reactor 31 from the atmosphere. The specimen exchange chamber 31 also has the valve 33A through which the gas or air in the specimen exchange chamber 31 is evacuated. To the upper end 34A of the treatment chamber 34 are connected cylinders 43A, 43B, 43C and 43D which store starting materials, e.g., arsine, phosphine, hydrogen sulfide, and trimethylindium, respectively. The pressure control devices 35 are connected to the cylinders 43A and 43B through the flow rate control device 41A and 41B, respectively, and through the gas control valves 40 positioned upstream and downstream of the flow rate control device 41A, and also upstream and downstream of the flow rate device 41B, respectively, and control the pressures of the arsine gas and phosphine gas from the cylinders 43A and 43B, respectively. The pressure control device 35 is connected to the cylinder 43C through the flow rate control device 41C and through the gas control valves 40 positioned upstream and downstream of the flow rate control device 41C, and controls the pressure of the hydrogen sulfide gas from the cylinder 43C. The pressure control device 35C is connected to the cylinder 43D through a plurality of the gas control valves 40 and controls the pressure of trimethylindium gas from the cylinders 43D. The pressure control devices 35A are connected to a purified hydrogen source (not shown) through the gas control valve 40. The cylinder 43D is also connected to the purified hydrogen source (not shown) through the gas control valves 40 and the flow rate control device 41D. On the other hand, the treatment chamber 34 is connected at the bottom thereof to the pressure control device 35D connected to a vacuum pump (not shown) through the seal valve 33B. These pressure control devices 35A through 35D control the gas pressure in the CVD reactor 34. The temperature control device 37 feeds the RF energy to the susceptor 36 using the coil which is furnished on the outside of the CVD reactor 34 by means of the electromagnetic interaction, which controls the temperature of the specimen 38 placed on the susceptor. The treatment chamber itself is cooled down by flowing water which is not shown in FIG. 20. Upon operation, a pretreated substrate or alternatively, a specimen to be treated, is introduced through the specimen exchange valve 32 into the specimen exchange chamber 31 and the specimen is mounted on the susceptor which has been transferred into the exchange chamber, and then the specimen exchange chamber 31 is evacuated. Thereafter, the specimen 38 with the susceptor 36 is transferred into the treatment chamber 34 through the seal valve 31 by the specimen exchange device 39 as shown in FIG. 20. By opening or closing the plurality of gas control valves 40 and adjusting the pressure control devices 35A, 35B and 35C, and the flow rate control devices 41A, 41B, 41C and 41D appropriately, suitable starting material gases can be introduced in suitable order and in suitable amounts or concentrations (partial pressures), into the treatment chamber 34 to allow hetero-epitaxial growth of a strained layer on the surface of the specimen or growth of an insulator layer such as a layer of P or S, and unused gases and/or exhaust gases are discharged through the valve 33B and the pressure control device 35D. After the formation of a desired layer or layers, the supply of the starting material gases is stopped by appropriately operating or adjusting the pressure control devices, the flow rate control devices and closing or opening the gas control valves. Then, the treated specimen is taken out of the treatment chamber 34 and a new specimen is introduced into the treatment chamber 34 from the specimen exchange chamber 31 by the specimen exchange device 39.

EXAMPLES

Hereafter, the present invention will be described in greater detail by examples. However, the present invention should not be construed as being limited thereto, but rather, various modifications and improvements can be made without departing from the spirit of the present invention.

Example 1

Using the surface treatment apparatus shown in FIG. 20, the process of fabricating the substrate with a surface layer structure according to the present invention will be described below.

(1) A mirror surface-finished, Si-doped GaAs wafer having an electron concentration of $10^{16}$ to $10^{18}$ cm$^{-3}$ was prepared as a starting specimen. A surface layer of the wafer was etched off in a thickness of several micrometers ($\mu$m) using a chemical solution for reducing the mechanical damage near the surface. Then, an oxide layer on the surface of the wafer was etched as much as possible with an acidic solution. Thus, preparation or pretreatment of the surface of the specimen 38 on which the surface layer structure of the present invention was to be realized, was completed.

(2) The specimen 38 was placed on the susceptor 36 in the specimen exchange chamber 31 of the surface treatment apparatus 30, and the chamber 31 was evacuated to less than $1 \times 10^{-5}$ Torr. Then, the specimen was transferred into the CVD reactor 34. Thereafter, during the process, purified hydrogen (hereafter, referred to simply as "hydrogen") from the hydrogen source (not shown) was supplied into the CVD reactor 34 at a flow rate of several liters/minute, adjusted, and the pressure in the CVD reactor 34 was kept in the range between 10 to 1000 Torr, or nominally 60 Torr, as adjusted by the pressure control device 35A.

(3) While supplying arsine (AsH$_3$) from the cylinder 43A to the CVD reactor 34 at a flow rate of 5 to 100 ml/minute as adjusted by the flow rate control device 41A, the specimen 38 was kept at 560° to 700° C. for 5 to 15 minutes by the temperature control device 37. This step was carried out to dissociate the native oxide on the surface of the specimen 38, and AsH$_3$ was supplied to prevent the evaporation of As from the surface of the specimen 38.

(4) The temperature of the specimen was set up to 550° to 700° C. by the temperature control device 37, and then the supply of AsH$_3$ gas from the cylinder 43A was stopped. Thereafter, PH$_3$ gas was supplied from the cylinder 43B at a flow rate of 5 to 1000 ml/minute as adjusted by the flow rate control device 41B, and at the same time, a carrier gas (hydrogen) containing trimethylindium (TMI) kept in the cylinder 43D held in the thermostat 42 at about room temperature, was supplied at a flow rate of 5 to 200 ml/minute as adjusted by the flow rate control device 41D. The time during which TMI was supplied was set up so that the thickness of the semiconductor fabricated was 1.5 nm. For example, that time was about 10 seconds under the conditions of a temperature of 650° C., a flow rate of 300 ml/minute of PH$_3$ gas, and a flow rate of 100 ml/minute of hydrogen carrying TMI. After this, the supply of hydrogen carrying TMI was stopped.

By the aforementioned step, a transition layer containing Ga and As, i.e., a layer of InGaAsP, grew epitaxially on the GaAs crystal or substrate 38. The lattice distance on the surface of the resulting structure is almost the same as that of the substrate in a plane parallel to the surface of the substrate, but differs from that of the substrate in a plane perpendicular to the surface of the substrate, thus giving rise to a strained layer, in other words, a pseudomorphic layer. The thickness of the strained layer is sufficiently smaller than the threshold thickness at which dislocation occurs as has been known in the art. However, once dislocation had for some reason occurred in a crystal, unnecessary or undesirable defect states could appear in the crystal and in which case there would be a possibility that the crystal has a poor quality to exhibit the effects of the present invention.

(5) While the supply of hydrogen as a carrier gas containing TMI was stopped, phosphine (PH3) gas was continued to be flown for an additional 1 to 10 minutes. In the meantime, the temperature of the specimen 38 was kept at 450° to 650° C. In this step, Ga, As, In and P diffused mutually in the aforementioned strained layer to form a stable transition layer, i.e., a layer of which the energy of strain is minimized. At the same time, the surface of the ultrathin transition layer was covered with P.

(6) Then, only hydrogen gas flow was continued and the temperature of the specimen 38 was decreased to room temperature. Thereafter, the supply of hydrogen gas was stopped. The specimen was transferred to the specimen exchange chamber 31 by the specimen exchange device 39 and taken out from the specimen exchange chamber 31.

Next, the characterization procedure and the results obtained are described.

An argon laser beam was irradiated on the surface of the specimen fabricated in the above process to obtain the photoluminescence intensity of the treated surface of the specimen. Results obtained are shown in FIG. 21, in which the horizontal axis indicates wavelength and the vertical axis indicates intensity of the photoluminescence.

Figure 21:
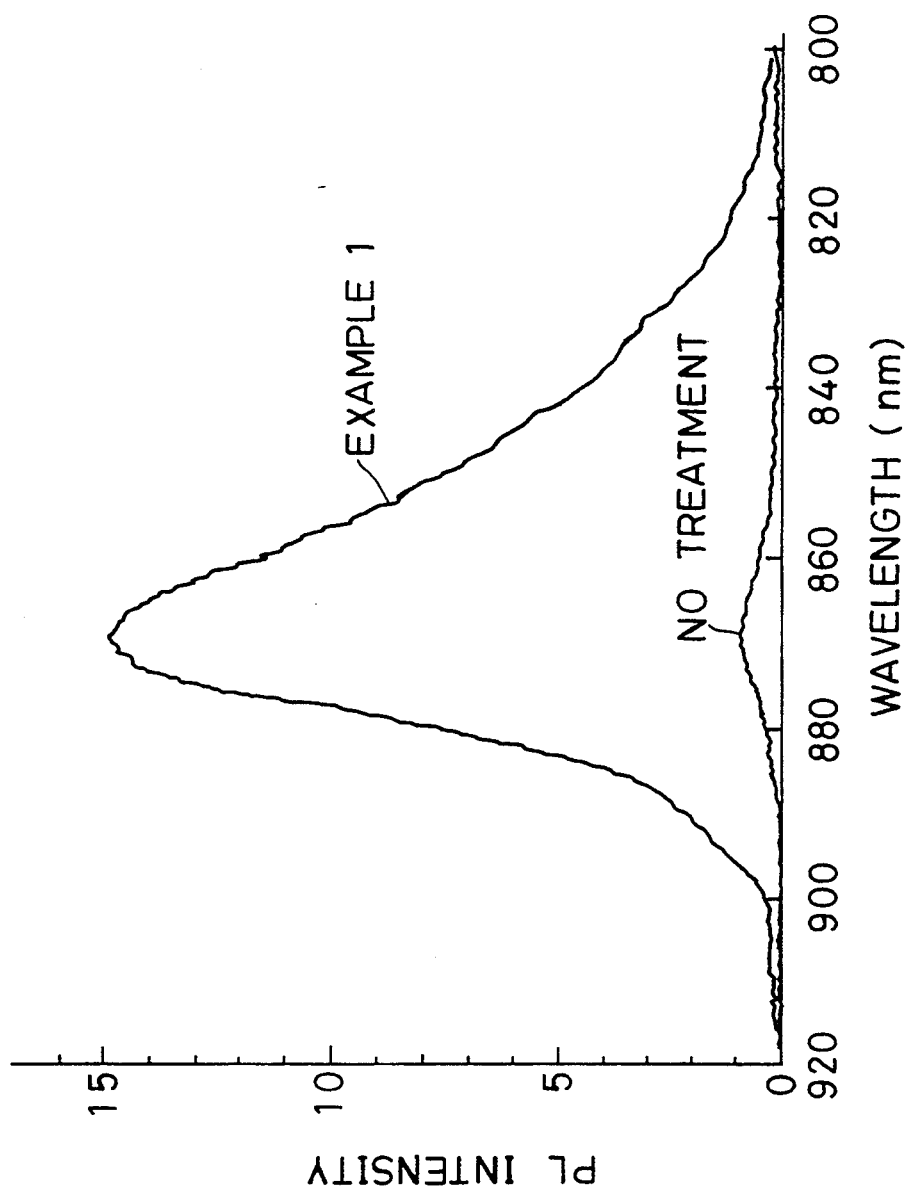
FIG. 21 is a graph plotting results of photoluminescence intensity measurements of samples of a semiconductor substrate with a surface layer structure, prepared in accordance with Example 1.

The case illustrated in FIG. 21 is an example where the electron concentration of the specimen was $2 \times 10^{17}$ cm$^{-3}$. As will be clear from FIG. 21, the photoluminescence intensity is increased by about 15 times as high as that of the nontreated specimen at peak intensity. The rate of increase in the photoluminescence intensity obtained in this example was about 3 times that attained by a conventional P-covered substrate (cf. D. J. Olego, et al., APL, vol. 45 (10), p. 1127 (1984)).

On the other hand, the peak of photoluminescence is positioned at a wavelength which corresponds to the band gap of GaAs regardless of the type of material. This suggests that no states due to quantum wells or the like were formed on the surface, and the properties of GaAs were maintained.

Analyses of the surface of the specimen by AES (Auger electron spectroscopy) and XPS (X-ray photoemission spectroscopy) confirmed that a layer rich in P and In was present near the surface of the substrate, and that exposure to air gave a structure containing oxide of P or P in an oxidized state.

Figure 22:
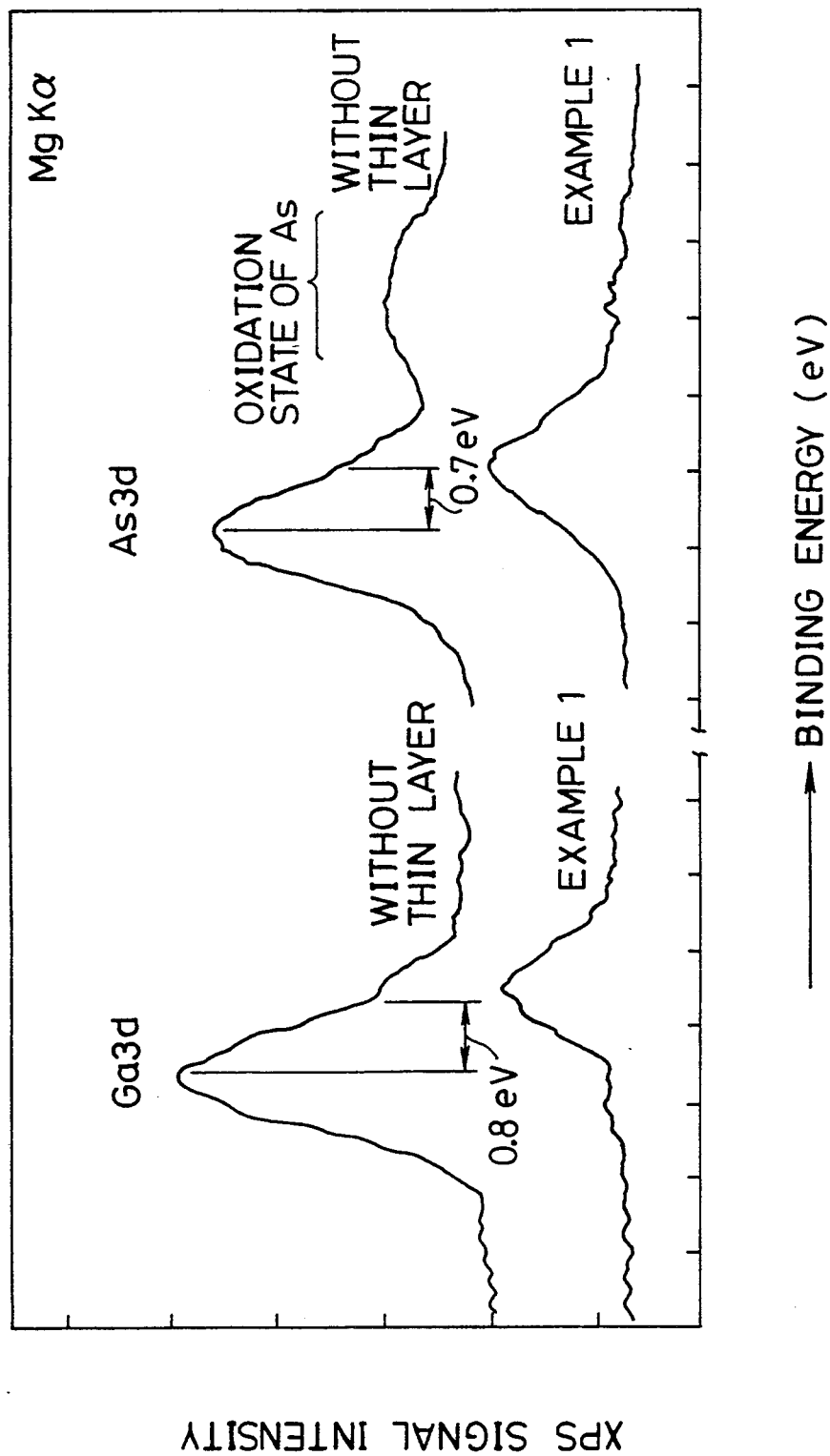
FIG. 22 is a graph plotting results of X-ray photoemission spectroscopic measurements of samples of a semiconductor substrate with a surface layer structure, prepared in accordance with Example 1.

FIG. 22 is a graph plotting results of X-ray photoemission spectroscopic measurements of a sample semiconductor substrate with the surface layer structure, prepared in this example. As will be apparent from FIG. 22, the bonding energy increased by about 0.7 to 0.8 eV in the substrate having an ultrathin layer of this example as compared with the substrate having no such an ultrathin layer. This indicates that the surface pinning which had occurred on the surface of nontreated GaAs substrate was relaxed. That is, surface depletion layer disappeared almost completely to render the energy band substantially flat.

As stated above, it was shown that in this example the structure shown in FIG. 6 was realized. The increase in the photoluminescence intensity means decrease in surface recombination, and also decrease to a greater extent of surface states in the band gap as seen from the GaAs substrate. Since P on the surface is considered to form unpaired electrons (dangling bonds) and thus there is no possibility that the surface states disappear, the aforementioned phenomenon demonstrates that the energy levels of the surface states which have been dominant are equal to or lower than the valence band maximum, Ev, of GaAs substrate. Although the above explanation involved In, the same results will occur for the use of Ga, Al or B.

Example 2

(1) to (5)
The same procedures as in Example 1 were repeated.
(6) The supply of PH3 gas was stopped, and the temperature was set up to 400° to 600° C. Then, diluted H2S was supplied at a flow rate of 0.1 to 1 liter/minute for about 30 minutes at 400° C. or for about 5 minutes at 600° C. In this occasion, diluted H2S gas had been prepared by diluting H2S gas with hydrogen to 1,000 ppm. The degree of dilution of the gas to be used is not particularly limited, but it is sufficient that the product of flow rate and temperature corresponds to or exceeds the aforementioned conditions. In this step, the substrate having a surface layer structure covered with S was realized.

(7) Only hydrogen gas was supplied, and the temperature was lowered to room temperature. Thereafter, the supply of hydrogen gas was stopped and the specimen was taken out through the specimen exchange chamber.

When the surface of the specimen prepared as described above was exposed to air, oxidization of P or the like near the surface was suppressed, and the photoluminescence intensity of this specimen increased to nearly 20 times that of a nontreated (nonexposed) substrate in terms of peak value. The wavelength at which a peak is obtained in the treated specimen is the same as the wavelength at which a peak is obtained in GaAs.

Therefore, the specimen of this example exhibited superior effects over the specimen of Example 1. The results of analyses revealed that the specimen of this example had the structure having a layer of S as shown in FIG. 6.

Example 3

(1) Specimens 1 and 2 prepared in Examples 1 and 2, respectively, were provided.

(2) Specimens 1 and 2 were placed in a vacuum device and evacuated to $1 \times 10^{-6}$ Torr or less. Thereafter, SiO granules stored in a boat in advance were evaporated as SiO molecules by application of an electric current to the resistance heater boat to deposit the SiO molecules on the surfaces of the both specimens thereby forming an amorphous insulator layer on each specimen. The rate of deposition was several nm/sec to several tens of nms/sec., and the thickness of the deposition was 150 nm.

(3) Next, both specimens (treated as described above) were placed in another vacuum device, and an aluminum (Al) electrode 200 nms thick was formed using a metal mask on the surface of SiO formed in the step (2) above using at the same degree of vacuum as used in the step (2) above. Then, similarly, a layer of AuGe 80 nms thick, a layer of Ni of 15 nms thick, and a layer of Au of 150 nms thick were formed in this order continuously on the back surface of GaAs opposite to the Al electrode.

(4) A YAG laser beam was irradiated onto the surface of Au deposited on the back surface of the GaAs to convert the back surface of the GaAs into an ohmic electrode.

The specimens thus prepared are called "specimen 1-3" and "specimen 2-3", respectively. The specimens 1-3 and 2-3 had structures which corresponded to the structure shown in FIG. 13 except that an Al electrode was provided on the surface of the insulator layer 18A and an ohmic electrode was provided on the back surface 12B of the substrate.

The capacitance-voltage characteristics of the specimens 1-3 and 2-3, respectively, were measured at 1 MHz in a usual manner and surface state densities were determined from the results obtained using the Terman method to obtain a minimum value of about $0.6 \times 10^{11}$ cm$^{-2}$eV$^{-1}$ for the both specimens. This value indicates that the surface state density of both specimens of the present invention was reduced to about 1/1,000 as compared with nontreated GaAs specimens and to half the value reported on the conventional S-covered GaAs substrate. Therefore, the specimens of the present invention had superior characteristics over the conventional substrates, which clearly demonstrates the effectiveness of the present invention.

Example 4

(1) The step (1) in Example 1 was performed.

Figure 23:
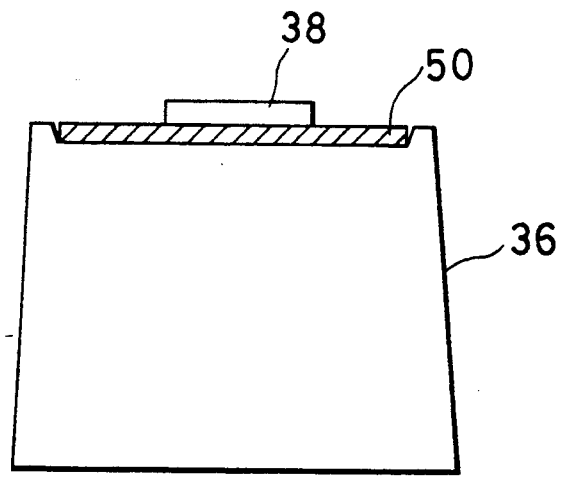
FIG. 23 is a cross sectional view showing the arrangement of a sample of a semiconductor substrate on a susceptor in the process of Example 4.

(2) In the step (2) in Example 1, the procedures were repeated in the presence of InP. FIG. 23 is a schematic cross sectional view showing an arrangement of the substrate on the susceptor. In FIG. 23, reference numeral 50 denotes an InP wafer. In the arrangement shown in FIG. 23, the InP wafer 50 was inserted between the specimen 38 (GaAs wafer) and the susceptor 36 (FIG. 20).

(3) While introducing PH$_3$ gas in the treatment chamber at a flow rate of 5 to 100 ml/minute, the specimen was maintained at 650° C. for about 5 minutes. This step was carried out in order to remove native oxide on the surface of the specimen.

(4) While continuing the supply of PH$_3$ gas, the temperature was set up to 450° to 600° C. and the specimen was exposed to PH$_3$ gas for 5 to 20 minutes.

In this step, since In was supplied in the form of gas from the InP wafer, a very thin transition layer of InGaAsP, composed mainly of InP containing Ga and As, was formed on the GaAs crystal as an epitaxially grown strained layer in the same manner as in Example 1.

(5) When the above-specified time was reached, the temperature of the specimen was decreased to 380° C. and then the supply of PH$_3$ gas was stopped.

(6) The temperature was lowered to room temperature while only hydrogen gas was made to flow, and then the supply of hydrogen gas was stopped. The specimen was taken out through the specimen exchange chamber.

The specimen thus obtained exhibited a photoluminescence intensity by about 15 times as high as that of nontreated specimen similar to Example 1. Results of analyses by AES and the like were similar to those in Example 1.

To note, P coverage on the surface of GaAs by the conventional method in which no InP was inserted, resulted in an increase in photoluminescence intensity by about .5 times or less.

Example 5

The procedures in Example 1 were repeated except that the simultaneous supply of TMI and PH$_3$ in step (4) of Example 1 was replaced by growth by one atomic layer on another using atomic layer epitaxy (ALE) method. That is, TMI and PH$_3$ were alternately supplied each 3 times (total of TMI and PH$_3$:6 times), each time for 3 seconds, to form an ultrathin layer of about 1.5 nm thick. Thereafter, the temperature of the specimen was set up to 450° to 650° C. while continuing to flow PH$_3$.

Example 6

Figure 24:
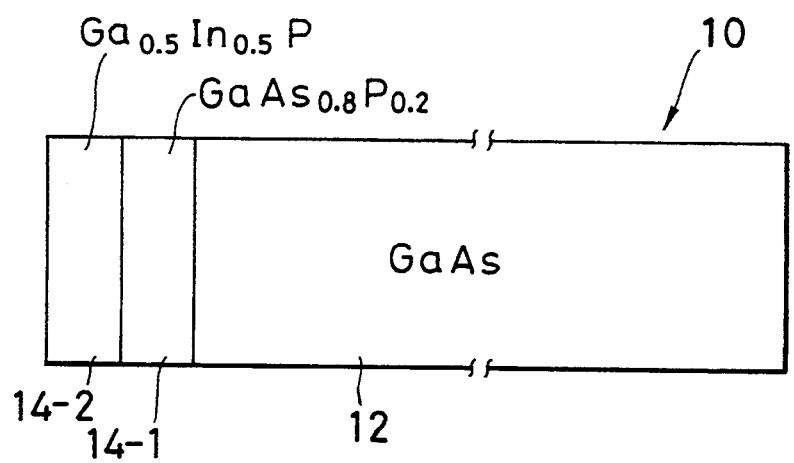
FIG. 24 is a schematic cross sectional view showing a semiconductor substrate with a surface layer structure having a bi-layer strained layer in accordance with an embodiment of the present invention.

FIG. 24 is a schematic cross sectional view showing a semiconductor substrate with a surface layer structure having a bi-layer strained layer corresponding to the structure schematically shown in FIG. 17. In the arrangement shown in FIG. 24, the substrate 12 is composed of GaAs, and the first and second subunit layers 14-1 and 14-2 consisting of GaAs$_{0.8}$P$_{0.2}$ and Ga$_{0.5}$In$_{0.5}$P, respectively (corresponding to GaAs$_{1-x}$P$_x$ where $x=0.2$; and Ga$_{1-y}$In$_y$P where $y=0.5$, respectively). The subunit layers 14-1 and 14-2 were about 0.7 nm, respectively. The subunit layers were realized by supplying starting materials in amounts corresponding to the thicknesses of the layers for appropriate times. More specifically, on the surface of GaAs substrate, a necessary amount of Ga in the form of trimethylgallium (TMC) was first supplied for a necessary time in an atmosphere of arsine (AsH$_3$) and phosphine (PH$_3$) in an appropriate mixing ratio, and then after stopping the supply of arsine gas, a necessary amount of In in the form of trimethylindium (TMI) was supplied for a necessary time.

In the aforementioned structure, the first subunit layer 14-1 had lattice constants about 1% smaller than those of the GaAs substrate, thus giving a compression stress onto the surface of the GaAs substrate. As a result, the band gap on the surface layer of the GaAs substrate widened as shown in FIG. 18, with the band gap of the first subunit layer 14-1 being widened by about 0.1 to 0.2 eV at each of the conduction band side and valence band side with respect to the valence band maximum and conduction band minimum of the GaAs substrate. This effect prevents the occurrence of a quantum well as indicated by symbol R in FIG. 16 which would otherwise have occurred in some cases in the aforementioned method such as that used in Example 1 or Example 2. Although such a quantum well which could occur in the aforementioned method would not cause localization of carriers provided the width of the well is small enough (because the states of carriers fall in the band), it is difficult to sufficiently control the width of the well during the fabrication steps. In this respect, the present invention can avoid this problem with ease.

On the other hand, the second subunit layer 14-2 had lattice constants about 1% greater than those of GaAs, giving rise to a tensile stress on the surface-side portion of the first subunit layer 14-1 to make its band gap narrower than that of the first subunit layer 14-1 without any strain. However, this change in the width of the band gap due to strain is rather small and the band gap of the surface-side portion of the first subunit layer 14-1 does not grow narrower than the band gap of the GaAs substrate. The band gap of the second subunit layer 14-2, which is inherently about 2 eV, will be widened in the vicinity of this interface with the first subunit layer 14-1 due to the effect of the compression stress applied thereto from the first subunit layer 14-1. From this, it follows that when the surface layer structure according to the present invention is used as a protective layer for protecting the surface of an FET made of a compound semiconductor, a reduction in noises due to the surface, a decrease in series resistance due to the surface depletion layer and a concomitant increase in gain can be realized. Further, when the surface layer structure of the present invention is used as a protective layer for protecting the surface of pn junctions of HBT or the like, a decrease in leakage current and a concomitant increase in current gain can be obtained in view of the type of the materials used and the strained layer being composed of a plurality of subunit layers.

In this example, the specimen showed an increase in the intensity of photoluminescence by about 10 times as compared to a nontreated specimen with sufficient reproducibility and controllability.

While the thicknesses of the first and second subunit layers were set up to 0.7 nm, respectively, they can be increased by 2 or 3 times as large without causing any dislocation due to misfitting, because the compositions of the subunit layers give rise to only a small difference in strain due to differences in the lattice constants therebetween. That is, since suppressing the occurrence of dislocations causes no decrease in the quality of the surface, the thicknesses of the subunit layers are not limited to a value in the vicinity of 0.7 nm, respectively. This limitation can be broadened by varying the values of x and y appropriately within the aforementioned ranges.

Example 7

An insulator layer such as $SiO_2$ layer was formed on the surface of the structure obtained in Example 6. In this case, attention must be paid to the distribution of stress in the strained layer on the surface thereof. More particularly, the insulator must be one which does not give any stress or gives a compression stress to the surface of the strained layer (the surface of the second subunit layer). On the other hand, a tensile stress may also be used provided the stress causes no deterioration of the surface layer structure.

Variations

As stated above, the essence of the present invention is in the provision, on the surface of a GaAs substrate, of an epitaxially grown ultrathin strained layer having a composition different from the GaAs substrate and optionally a covering layer of P, or S, or P in a state where it is bonded with oxygen on the surface of the ultrathin strained layer. This results in the valence band maximum of the ultrathin strained layer being lower than the valence band maximum of the GaAs substrate, and the surface states given by P, S or P in an oxidized state appearing at energy levels lower than that of the valence band maximum of the GaAs substrate. The surface layer structure according to the present invention also gives rise to improved surface characteristics.

When the covering layer is applied, the surface layer structure of the present invention can be fabricated readily and with good controllability by the method of the present invention. The step of exposing a substrate to a gas containing P or S kept in nearly a thermal equilibrium plays an important role.

Although in the foregoing examples, explanation has been focused on the use of GaAs substrate, the present invention is not limited to GaAs substrate, but various similar semiconductor substrates such as those containing Ga and As and one or more additional elements specified above, can be used to realize the aforementioned surface layer structure of the present invention, thereby obtaining similar effects to those described above.

It is obvious that B can also be used similarly because it is sufficient to make a crystal with elements having atomic radii smaller than those of the elements constituting the substrate in order to deposit an ultrathin layer having a band gap greater than that of the substrate. It is also possible to use Al in the composition of the ultrathin layer because the valence band maximum of AlGaAs is at an energy level lower than the valence band maximum of GaAs, and the band gap of AlGaAs is wider than that of GaAs.

The deposition of SiO by resistance heat vapor deposition may be replaced by deposition of $SiO_2$ by an ECR plasma CVD method. In the latter method, $SiH_4$ and $O_2$ are converted into radicals by electron cyclotron resonance to deposit silicon oxide on the surface of the strained layer.

In Example 6, the proportion of As to P in the composition ($GaAs_{1-x}P_x$; x=0.2) of the first subunit layer and the proportion of Ga to In in the composition ($Ga_{1-y}In_yP$; y=0.5) of the second subunit layer of the strained layer may be varied widely. For example, the compositions of the two subunit layers may vary continuously from one to another still giving similar results to those described above. Also, similar results can be obtained with the value of y near y=1. In this case, the thickness of the strained layer must be smaller than in Example 6 in order to prevent the occurrence of dislocations in the crystal.

The present invention has been described in detail with respect to preferred embodiments, and it will now be apparent from the foregoing to those skilled in the art that changes and modifications may be made without departing from the invention in its broader aspects. It is the intention, therefore, in the appended claims, to cover all such changes and modifications as fall within the true spirit of the invention.

What is claimed is:

1. A semiconductor substrate consisting essentially of a III-V compound semiconductor containing Ga and As, and having a surface layer structure provided on a surface of the semiconductor substrate, the semiconductor substrate having a first valence band maximum, and a first conduction band minimum, wherein said surface layer structure comprises an ultrathin strained layer about 0.5 nm to about 3 nm thick, epitaxially grown on the surface of said semiconductor substrate, said ultrathin strained layer consisting essentially of at least one first element selected from the group consisting of indium, gallium, aluminum and boron, and at least one second element selected from the group consisting of arsenic and phosphorus, said strained layer having a composition different from that of said semiconductor substrate, and wherein said strained layer has a second valence band maximum and a second conduction band minimum, said second valence band maximum being at an energy position lower in energy than that of said first valence band maximum of said semiconductor substrate.

2. A semiconductor substrate as claimed in claim 1, wherein said ultrathin layer has a first portion positioned on a side of said semiconductor substrate, said first portion of said strained layer having lattice constants equal to or smaller than those of said semiconductor substrate.

3. A semiconductor substrate as claimed in claim 2, wherein said ultrathin layer has a second portion positioned on an uppermost side thereof, said second portion having lattice constants greater than those of said first portion.

4. A semiconductor substrate as claimed in claim 2, wherein said strained layer has on its outermost surface a layer of phosphorus.

5. A semiconductor substrate as claimed in claim 2, wherein said strained layer has on its outermost surface a layer of sulfur.

6. A semiconductor substrate as claimed in claim 2, wherein said strained layer has on its outermost surface a layer of phosphorus in a state wherein it is bonded with oxygen.

7. A semiconductor substrate as claimed in claim 2, wherein said strained layer contains indium.

8. A semiconductor substrate as claimed in claim 7, wherein said strained layer contains indium phosphide.

9. A semiconductor substrate as claimed in claim 7, wherein said strained layer contains indium gallium arsenide phosphide.

10. A semiconductor substrate as claimed in claim 8, wherein said strained layer has on its outermost surface a layer of phosphorus bonded with oxygen.

11. A semiconductor substrate as claimed in claim 9, wherein said strained layer has on its outermost surface a layer of phosphorus bonded with oxygen.

12. A semiconductor substrate as claimed in claim 2, wherein said strained layer has a thickness of 15 Angstroms or less.

13. A semiconductor substrate as claimed in claim 3, wherein said ultrathin layer exerts one of no stress and compression stress to an interface between said strained layer and said amorphous insulator layer and which has thereon an amorphous insulator layer.

14. A semiconductor substrate as claimed in claim 13, wherein said amorphous insulator layer comprises silicon oxide.

15. A semiconductor device comprising a semiconductor substrate having a functional portion provided on a surface thereof and having a p-n junction, said semiconductor substrate consisting essentially of a III-V compound semiconductor containing Ga and As, and having a surface layer structure provided on the surface of the semiconductor substrate and having a composition different from that of the semiconductor substrate, the semiconductor substrate having a first valence band maximum, and a first conduction band minimum, wherein said surface layer structure comprises an ultrathin strained layer about 0.5 nm to about 3 nm thick epitaxially grown on the surface of said semiconductor substrate and consisting essentially of at least one first element selected from the group consisting of indium, gallium, aluminum and boron, and at least one second element selected from the group consisting of arsenic and phosphorus, said strained layer having a composition different from that of said semiconductor substrate, and wherein said strained layer has a second valence band maximum and a second conduction band minimum, said second valence band maximum of said strained layer being at an energy position lower in energy than that of said first valence band maximum of said semiconductor substrate.

16. The semiconductor device as claimed in claim 15, wherein said semiconductor device is a laser diode.

17. The semiconductor device as claimed in claim 15, wherein said semiconductor device is a field effect transistor.

18. The semiconductor device as claimed in claim 15, wherein said semiconductor device is a heterojunction bipolar transistor.

19. A semiconductor substrate consisting essentially of a III-V compound semiconductor containing Ga and As, and having a surface layer structure provided on a surface of the semiconductor substrate, the semiconductor substrate having a first valence band maximum, and a first conduction band minimum, wherein said surface layer structure comprises a strained layer epitaxially grown on the surface of said semiconductor substrate and consisting essentially of at least one first element selected from the group consisting of indium, gallium, aluminum and boron, and at least one second element selected from the group consisting of arsenic and phosphorus, said strained layer having an uppermost surface, and an innermost surface which contacts said surface of the semiconductor substrate, and said strained layer having a composition different from that of said semiconductor substrate;

said strained layer having a second valence band maximum and a second conduction band minimum, said second valence band maximum being lower in energy level than said first valence band maximum of said semiconductor substrate; and said strained layer having a thickness small enough to render surface states appearing on said uppermost surface of said strained layer lower in energy level than said first valence band maximum of the surface of said semiconductor substrate when an electric field is applied.

20. A semiconductor device having a semiconductor substrate and a functional portion provided on the semiconductor substrate and having a p-n junction, the semiconductor substrate consisting essentially of a III-V compound semiconductor containing Ga and As, and having a surface layer structure provided on the semiconductor substrate, the semiconductor substrate having a first valence band maximum, and a first conduction band minimum, wherein said surface layer structure comprises a strained layer epitaxially grown on the surface of said semiconductor substrate and consisting essentially of at least one first element selected from the group consisting of indium, gallium, aluminum and boron, and at least one second element selected from the group consisting of arsenic and phosphorus, said strained layer having an uppermost surface, and an innermost surface which contacts said surface of the semiconductor substrate, and said strained layer having a composition different from that of said semiconductor substrate;

said strained layer having a second valence band maximum and a second conduction band minimum, said second valence band maximum being lower in energy level than that of said first valence band maximum of said semiconductor substrate; and said strained layer having a thickness small enough to render surface states appearing on said uppermost surface of the strained layer lower in energy level than said first valence band maximum of the surface of the semiconductor substrate when an electric field is applied.

21. The semiconductor substrate as claimed in claim 1, wherein said ultrathin layer has thereon an amorphous insulator layer which gives a compression stress to an interface between said strained layer and said amorphous insulator layer.

22. The semiconductor substrate as claimed in claim 21, wherein said amorphous insulator layer comprises silicon oxide.

23. The semiconductor substrate as claimed in claim 1, wherein said ultrathin layer has thereon an amorphous insulator layer which gives no stress to an interface between said strained layer and said amorphous insulator layer.

24. A semiconductor substrate as claimed in claim 4 wherein said ultrathin layer exerts one of no stress and compression stress to an interface between said strained layer and said amorphous insulator layer and which has thereon an amorphous insulator layer.

25. A semiconductor substrate as claimed in claim 8 wherein said ultrathin layer exerts one of no stress and compression stress to an interface between said strained layer and said amorphous insulator layer and which has thereon an amorphous insulator layer.

26. A semiconductor substrate as claimed in claim 12 wherein said ultrathin layer exerts one of no stress and compression stress to an interface between said strained layer and said amorphous insulator layer and which has thereon an amorphous insulator layer.

27. The semiconductor substrate as claimed in claim 1, wherein the surface of said semiconductor substrate on which said strained layer is provided contains phosphorus as an impurity.

* * * * *